US006922272B1

(12) United States Patent
de Groot et al.

(10) Patent No.: US 6,922,272 B1
(45) Date of Patent: Jul. 26, 2005

(54) METHOD AND APPARATUS FOR LEVELING THERMAL STRESS VARIATIONS IN MULTI-LAYER MEMS DEVICES

(75) Inventors: Wilhelmus de Groot, Palo Alto, CA (US); Dinesh Maheshwari, Fremont, CA (US)

(73) Assignee: Silicon Light Machines Corporation, Sunnyvale, CA (US)

( * ) Notice: Subject to any disclaimer, the term of this patent is extended or adjusted under 35 U.S.C. 154(b) by 108 days.

(21) Appl. No.: 10/367,440

(22) Filed: Feb. 14, 2003

(51) Int. Cl.$^7$ .............................................. G02B 26/00
(52) U.S. Cl. ....................... 359/291; 257/701; 257/747; 257/758; 359/290; 359/572; 359/892
(58) Field of Search ................................ 257/701, 747, 257/758, 688, 706, 713; 359/290, 291, 572, 892, 295, 569; 216/13, 38; 438/52, 53

(56) References Cited

U.S. PATENT DOCUMENTS

| | | |
|---|---|---|
| 1,525,550 A | 2/1925 | Jenkins |
| 1,548,262 A | 8/1925 | Freedman |
| RE16,767 E | 10/1927 | Jenkins |
| 1,814,701 A | 7/1931 | Ives |
| 2,415,226 A | 2/1947 | Sziklai ........................ 178/5.4 |
| 2,783,406 A | 2/1957 | Vanderhooft ................. 313/70 |
| 2,920,529 A | 1/1960 | Blythe ........................... 88/73 |
| 2,991,690 A | 7/1961 | Grey et al. ................... 88/16.6 |
| RE25,169 E | 5/1962 | Glenn |
| 3,256,465 A | 6/1966 | Weissenstern et al. ...... 317/101 |

(Continued)

FOREIGN PATENT DOCUMENTS

| | | | | |
|---|---|---|---|---|
| DE | 32 33 195 A1 | 3/1983 | ............ | H01L/23/52 |
| DE | 43 23 799 A1 | 1/1994 | ............ | H01L/23/50 |
| DE | 197 23 618 A1 | 12/1997 | ............. | G03F/1/14 |
| DE | 197 51 716 A1 | 5/1998 | ........... | G02B/27/14 |
| DE | 198 46 532 C1 | 5/2000 | ........... | G02B/27/09 |

(Continued)

OTHER PUBLICATIONS

R. Apte, "Grating Light Valves for High Resolution Displays", Solid State Sensors and Actuators Workshop, Ph D. Dissertation, Stanford University (Jun. 1994).
O. Solgaard, "Integrated Semiconductor Light Modulators for Fiber–Optic and Display Applications", Ph.D. Dissertation, Stanford University Feb., 1992.

(Continued)

*Primary Examiner*—David Nelms
*Assistant Examiner*—Dao H. Nguyen
(74) *Attorney, Agent, or Firm*—Okamoto & Benedicto LLP

(57) ABSTRACT

A MEMS device such as a grating light valve™ light modulator is athermalized such that the force required to deflect the movable portion of the MEMS device remains constant over a range of temperatures. In MEMS embodiments directed to a grating light valve™ light modulator, a ribbon is suspended over a substrate, and the ribbon tension is kept constant over a temperature range by adjusting the aggregate thermal coefficient of expansion of the ribbon to match the aggregate thermal coefficient of expansion of the substrate. Various opposition materials have an opposite thermal coefficient of expansion as the aluminum layer of a grating light valve™ light modulator ribbon, using the thermal coefficient of expansion of the substrate as a zero coefficient reference. The adjustment of the thermal coefficient of expansion of the ribbon can be performed variously by thickening existing layers of opposition material or adding additional layers of new opposition material to the ribbon, or reducing the aluminum in aluminum layer. The aluminum layer may be reduced variously by reducing the thickness of the aluminum layer, or reducing the surface area that the aluminum covers, or reducing both the surface area and the thickness. Embodiments may combine the reduction of aluminum with the use of opposition materials.

18 Claims, 11 Drawing Sheets

U.S. PATENT DOCUMENTS

| | | | |
|---|---|---|---|
| 3,388,301 A | 6/1968 | James | 317/234 |
| 3,443,871 A | 5/1969 | Chitayat | 356/106 |
| 3,553,364 A | 1/1971 | Lee | 178/7.3 |
| 3,576,394 A | 4/1971 | Lee | 178/7.3 |
| 3,600,798 A | 8/1971 | Lee | 29/592 |
| 3,656,837 A | 4/1972 | Sandbank | 350/161 |
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Ernstoff et al. | 178/5.4 BD |
| 3,783,184 A | 1/1974 | Ernstoff et al. | 178/5.4 BD |
| 3,792,916 A | 2/1974 | Sarna | 350/163 |
| 3,802,769 A | 4/1974 | Rotz et al. | 352/43 |
| 3,811,186 A | 5/1974 | Larnerd et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.5 D |
| 3,896,338 A | 7/1975 | Nathanson et al. | 315/373 |
| 3,915,548 A | 10/1975 | Opittek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,011,009 A | 3/1977 | Lama et al. | 350/162 R |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/68 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 128/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/358 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,487,677 A | 12/1984 | Murphy | 204/247 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,556,899 A * | 12/1985 | Kurihara et al. | 257/747 |
| 4,558,171 A | 12/1985 | Gantley et al. | 174/52 FP |
| 4,561,011 A * | 12/1985 | Kohara et al. | 257/713 |
| 4,561,044 A | 12/1985 | Ogura et al. | 362/84 |
| 4,566,935 A | 1/1986 | Hornbeck | 156/626 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |
| 4,641,193 A | 2/1987 | Glenn | 358/233 |
| 4,645,881 A | 2/1987 | LeToumelin et al. | 379/252 |
| 4,646,158 A | 2/1987 | Ohno et al. | 358/236 |
| 4,649,085 A | 3/1987 | Landram | 428/620 |

| | | | | | |
|---|---|---|---|---|---|
| 4,649,432 A | 3/1987 | Watanabe ............... 358/241 | 4,963,012 A | 10/1990 | Tracy et al. ............. 350/641 |
| 4,652,932 A | 3/1987 | Miyajima et al. ........ 358/236 | 4,970,575 A | 11/1990 | Soga et al. .............. 357/72 |
| 4,655,539 A | 4/1987 | Caulfield et al. ......... 350/3.6 | 4,978,202 A | 12/1990 | Yang ................. 350/331 R |
| 4,660,938 A | 4/1987 | Kazan .................. 350/355 | 4,982,184 A | 1/1991 | Kirkwood .............. 340/783 |
| 4,661,828 A | 4/1987 | Miller, Jr. et al. ........ 346/108 | 4,982,265 A | 1/1991 | Watanabe et al. .......... 357/75 |
| 4,662,746 A | 5/1987 | Hornbeck ............... 350/269 | 4,984,824 A | 1/1991 | Antes et al. .............. 283/91 |
| 4,663,670 A | 5/1987 | Ito et al. ................ 358/245 | 4,999,308 A | 3/1991 | Nishiura et al. ............. 437/4 |
| 4,687,326 A | 8/1987 | Corby, Jr. ................. 356/5 | 5,003,300 A | 3/1991 | Wells .................. 340/705 |
| 4,698,602 A | 10/1987 | Armitage ............... 332/7.51 | 5,009,473 A | 4/1991 | Hunter et al. ............. 350/6.6 |
| 4,700,276 A | 10/1987 | Freyman et al. .......... 361/403 | 5,013,141 A | 5/1991 | Sakata .................. 350/348 |
| 4,707,064 A | 11/1987 | Dobrowolski et al. ... 350/96.19 | 5,018,256 A | 5/1991 | Hornbeck .............. 29/25.01 |
| 4,709,995 A | 12/1987 | Kuribayashi et al. ....... 350/350 | 5,022,750 A | 6/1991 | Flasck ................... 353/31 |
| 4,710,732 A | 12/1987 | Hornbeck ............... 332/7.51 | 5,023,905 A | 6/1991 | Wells et al. ............... 379/96 |
| 4,711,526 A | 12/1987 | Hennings et al. .......... 350/170 | 5,024,494 A | 6/1991 | Williams et al. ........... 350/3.6 |
| 4,714,326 A | 12/1987 | Usui et al. ............... 350/485 | 5,028,939 A | 7/1991 | Hornbeck et al. .......... 346/160 |
| 4,717,066 A | 1/1988 | Goldenberg et al. ........ 228/179 | 5,031,144 A | 7/1991 | Persky |
| 4,719,507 A | 1/1988 | Bos ...................... 358/92 | 5,035,473 A | 7/1991 | Kuwayama et al. .......... 350/3.7 |
| 4,721,629 A | 1/1988 | Sakai et al. ............... 427/35 | 5,037,173 A | 8/1991 | Sampsell et al. ............ 385/17 |
| 4,722,593 A | 2/1988 | Shimazaki ............... 350/336 | 5,039,628 A | 8/1991 | Carey .................. 437/183 |
| 4,724,467 A | 2/1988 | Yip et al. ................. 355/71 | 5,040,052 A | 8/1991 | McDavid ................ 357/80 |
| 4,728,185 A | 3/1988 | Thomas ................. 353/122 | 5,041,395 A | 8/1991 | Steffen ................. 437/206 |
| 4,743,091 A | 5/1988 | Gelbart ................. 350/252 | 5,041,851 A | 8/1991 | Nelson ................. 346/160 |
| 4,744,633 A | 5/1988 | Sheiman ................ 350/132 | 5,043,917 A | 8/1991 | Okamoto ............... 364/518 |
| 4,747,671 A | 5/1988 | Takahashi et al. .......... 350/336 | 5,048,077 A | 9/1991 | Wells et al. ............... 379/96 |
| 4,751,509 A | 6/1988 | Kubota et al. ............ 340/784 | 5,049,901 A | 9/1991 | Gelbart ................. 346/108 |
| 4,761,253 A | 8/1988 | Antes .................... 264/1.3 | 5,058,992 A | 10/1991 | Takahashi ............... 359/567 |
| 4,763,975 A | 8/1988 | Scifres et al. ........... 350/96.15 | 5,060,058 A | 10/1991 | Goldenberg et al. .......... 358/60 |
| 4,765,865 A | 8/1988 | Gealer et al. ............. 156/647 | 5,061,049 A | 10/1991 | Hornbeck ............... 359/224 |
| 4,772,094 A | 9/1988 | Sheiman ................ 350/133 | 5,066,614 A | 11/1991 | Dunnaway et al. ......... 437/209 |
| 4,797,694 A | 1/1989 | Agostinelli et al. ......... 346/160 | 5,068,205 A | 11/1991 | Baxter et al. ............. 437/205 |
| 4,797,918 A | 1/1989 | Lee et al. ................. 380/20 | 5,072,239 A | 12/1991 | Mitcham et al. .......... 346/108 |
| 4,801,194 A | 1/1989 | Agostinelli et al. ......... 350/356 | 5,072,418 A | 12/1991 | Boutaud et al. ........ 364/715.06 |
| 4,803,560 A | 2/1989 | Matsunaga et al. ......... 359/236 | 5,074,947 A | 12/1991 | Estes et al. ............. 156/307.3 |
| 4,804,641 A | 2/1989 | Arlt et al. ................ 437/227 | 5,075,940 A | 12/1991 | Kuriyama et al. ......... 29/25.03 |
| 4,807,021 A | 2/1989 | Okumura ................. 357/75 | 5,079,544 A | 1/1992 | DeMond et al. ........... 340/701 |
| 4,807,965 A | 2/1989 | Garakani ................. 350/131 | 5,081,617 A | 1/1992 | Gelbart ................. 369/112 |
| 4,809,078 A | 2/1989 | Yabe et al. ............... 358/236 | 5,083,857 A | 1/1992 | Hornbeck ............... 359/291 |
| 4,811,082 A | 3/1989 | Jacobs et al. .............. 357/80 | 5,085,497 A | 2/1992 | Um et al. ................ 359/848 |
| 4,811,210 A | 3/1989 | McAulay ................ 364/200 | 5,089,903 A | 2/1992 | Kuwayama et al. ........... 359/15 |
| 4,814,759 A | 3/1989 | Gombrich et al. .......... 340/771 | 5,093,281 A | 3/1992 | Eshima ................. 437/217 |
| 4,817,850 A | 4/1989 | Wiener-Avnear et al. ... 228/119 | 5,096,279 A | 3/1992 | Hornbeck et al. .......... 359/230 |
| 4,824,200 A | 4/1989 | Isono et al. ............. 350/96.16 | 5,099,353 A | 3/1992 | Hornbeck ............... 359/291 |
| 4,827,391 A | 5/1989 | Sills ..................... 363/41 | 5,101,184 A | 3/1992 | Antes .................. 235/454 |
| 4,829,365 A | 5/1989 | Eichenlaub ................ 358/3 | 5,101,236 A | 3/1992 | Nelson et al. ............. 355/229 |
| 4,836,649 A | 6/1989 | Ledebuhr et al. ........ 350/331 R | 5,103,334 A | 4/1992 | Swanberg ............... 359/197 |
| 4,856,863 A | 8/1989 | Sampsell et al. ........ 350/96.16 | 5,105,207 A | 4/1992 | Nelson ................. 346/160 |
| 4,856,869 A | 8/1989 | Sakata et al. .......... 350/162.18 | 5,105,299 A | 4/1992 | Anderson et al. ........... 359/223 |
| 4,859,012 A | 8/1989 | Cohn ................. 350/96.24 | 5,105,369 A | 4/1992 | Nelson ................. 364/525 |
| 4,859,060 A | 8/1989 | Katagiri et al. ............ 356/352 | 5,107,372 A | 4/1992 | Gelbart et al. ............. 359/824 |
| 4,866,488 A | 9/1989 | Frensley .................. 357/4 | 5,112,436 A | 5/1992 | Bol .................... 156/643 |
| 4,882,683 A | 11/1989 | Rupp et al. ............... 364/521 | 5,113,272 A | 5/1992 | Reamey ................. 359/53 |
| 4,893,509 A | 1/1990 | MacIver et al. ......... 73/517 AV | 5,113,285 A | 5/1992 | Franklin et al. ............ 359/465 |
| 4,896,325 A | 1/1990 | Coldren .................. 372/20 | 5,115,344 A | 5/1992 | Jaskie .................. 359/573 |
| 4,896,948 A | 1/1990 | Dono et al. .............. 350/355 | 5,119,204 A | 6/1992 | Hashimoto et al. ......... 358/254 |
| 4,897,708 A | 1/1990 | Clements ................. 357/65 | 5,121,343 A | 6/1992 | Faris ................... 395/111 |
| 4,902,083 A | 2/1990 | Wells ................... 350/6.6 | 5,126,812 A | 6/1992 | Greiff .................. 357/25 |
| 4,915,463 A | 4/1990 | Barbee, Jr. ................ 350/1.1 | 5,126,826 A | 6/1992 | Kauchi et al. .............. 357/72 |
| 4,915,479 A | 4/1990 | Clarke .................. 350/345 | 5,126,836 A | 6/1992 | Um .................... 358/60 |
| 4,924,413 A | 5/1990 | Suwannukul ............. 364/521 | 5,128,660 A | 7/1992 | DeMond et al. ........... 340/707 |
| 4,926,241 A | 5/1990 | Carey ................... 357/75 | 5,129,716 A | 7/1992 | Holakovszky et al. ......... 351/50 |
| 4,930,043 A | 5/1990 | Wiegand ................ 361/283 | 5,132,723 A | 7/1992 | Gelbart .................. 355/40 |
| 4,934,773 A | 6/1990 | Becker .................. 350/6.6 | 5,132,812 A | 7/1992 | Takahashi et al. ............ 359/9 |
| 4,940,309 A | 7/1990 | Baum ................... 350/171 | 5,136,695 A | 8/1992 | Goldshlag et al. .......... 395/275 |
| 4,943,815 A | 7/1990 | Aldrich et al. ............. 346/108 | 5,137,836 A | 8/1992 | Lam ..................... 437/8 |
| 4,945,773 A | 8/1990 | Sickafus ............... 73/862.59 | 5,142,303 A | 8/1992 | Nelson ................. 346/108 |
| 4,949,148 A | 8/1990 | Bartelink ................. 357/74 | 5,142,405 A | 8/1992 | Hornbeck ............... 359/226 |
| 4,950,890 A | 8/1990 | Gelbart .............. 250/237 G | 5,142,677 A | 8/1992 | Ehlig et al. ............... 395/650 |
| 4,952,925 A | 8/1990 | Haastert ................ 340/784 | 5,144,472 A | 9/1992 | Sang, Jr. et al. ............ 359/254 |
| 4,954,789 A | 9/1990 | Sampsell ................ 330/4.3 | 5,147,815 A | 9/1992 | Casto .................... 437/51 |
| 4,956,619 A | 9/1990 | Hornbeck ............... 330/4.3 | 5,148,157 A | 9/1992 | Florence ................ 340/783 |
| 4,961,633 A | 10/1990 | Ibrahim et al. ............. 350/392 | 5,148,506 A | 9/1992 | McDonald ............... 385/16 |

| | | | |
|---|---|---|---|
| 5,149,405 A | 9/1992 | Bruns et al. ............. 204/129.1 |
| 5,150,205 A | 9/1992 | Um et al. .................... 358/60 |
| 5,151,718 A | 9/1992 | Nelson ..................... 346/160 |
| 5,151,724 A | 9/1992 | Kikinis ...................... 357/17 |
| 5,151,763 A | 9/1992 | Marek et al. ................. 357/26 |
| 5,153,770 A | 10/1992 | Harris ...................... 359/245 |
| 5,155,604 A | 10/1992 | Miekka et al. ................ 359/2 |
| 5,155,615 A | 10/1992 | Tagawa .................... 359/213 |
| 5,155,778 A | 10/1992 | Magel et al. ................. 385/18 |
| 5,155,812 A | 10/1992 | Ehlig et al. ................ 395/275 |
| 5,157,304 A | 10/1992 | Kane et al. ................ 313/495 |
| 5,159,485 A | 10/1992 | Nelson ..................... 359/291 |
| 5,161,042 A | 11/1992 | Hamada ...................... 359/41 |
| 5,162,787 A | 11/1992 | Thompson et al. ......... 340/794 |
| 5,164,019 A | 11/1992 | Sinton ....................... 136/249 |
| 5,165,013 A | 11/1992 | Faris ......................... 395/104 |
| 5,168,401 A | 12/1992 | Endriz ...................... 359/625 |
| 5,168,406 A | 12/1992 | Nelson ..................... 359/855 |
| 5,170,156 A | 12/1992 | DeMond et al. ............ 340/794 |
| 5,170,269 A | 12/1992 | Lin et al. ....................... 359/9 |
| 5,170,283 A | 12/1992 | O'Brien et al. ............. 359/291 |
| 5,172,161 A | 12/1992 | Nelson ..................... 355/200 |
| 5,172,262 A | 12/1992 | Hornbeck ................. 359/223 |
| 5,177,724 A | 1/1993 | Gelbart .................... 369/44.16 |
| 5,178,728 A | 1/1993 | Boysel et al. .............. 156/656 |
| 5,179,274 A | 1/1993 | Sampsell ................ 250/208.2 |
| 5,179,367 A | 1/1993 | Shimizu ................... 340/700 |
| 5,181,231 A | 1/1993 | Parikh et al. ................. 377/26 |
| 5,182,665 A | 1/1993 | O'Callaghan et al. ........ 359/95 |
| 5,185,660 A | 2/1993 | Um ............................. 358/60 |
| 5,185,823 A | 2/1993 | Kaku et al. |
| 5,188,280 A | 2/1993 | Nakao et al. .............. 228/123 |
| 5,189,404 A | 2/1993 | Masimo et al. ............ 340/720 |
| 5,189,505 A | 2/1993 | Bartelink .................. 257/419 |
| 5,191,405 A | 3/1993 | Tomita et al. ............. 257/777 |
| 5,192,864 A | 3/1993 | McEwen et al. ........... 250/234 |
| 5,192,946 A | 3/1993 | Thompson et al. ......... 340/794 |
| 5,198,895 A | 3/1993 | Vick ......................... 358/103 |
| D334,557 S | 4/1993 | Hunter et al. ............. D14/114 |
| D334,742 S | 4/1993 | Hunter et al. ............. D14/113 |
| 5,202,785 A | 4/1993 | Nelson ..................... 359/214 |
| 5,206,629 A | 4/1993 | DeMond et al. ............ 340/719 |
| 5,206,829 A | 4/1993 | Thakoor et al. |
| 5,208,818 A | 5/1993 | Gelbart et al. .............. 372/30 |
| 5,208,891 A | 5/1993 | Prysner .................... 385/116 |
| 5,210,637 A | 5/1993 | Puzey ...................... 359/263 |
| 5,212,115 A | 5/1993 | Cho et al. .................. 437/208 |
| 5,212,555 A | 5/1993 | Stoltz ....................... 358/206 |
| 5,212,582 A | 5/1993 | Nelson ..................... 359/224 |
| 5,214,308 A | 5/1993 | Nishiguchi et al. ......... 257/692 |
| 5,214,419 A | 5/1993 | DeMond et al. ............ 340/794 |
| 5,214,420 A | 5/1993 | Thompson et al. ......... 340/795 |
| 5,216,278 A * | 6/1993 | Lin et al. .................... 257/688 |
| 5,216,537 A | 6/1993 | Hornbeck ................. 359/291 |
| 5,216,544 A | 6/1993 | Horikawa et al. .......... 359/622 |
| 5,219,794 A | 6/1993 | Satoh et al. ................ 437/209 |
| 5,220,200 A | 6/1993 | Blanton .................... 257/778 |
| 5,221,400 A | 6/1993 | Staller et al. ............... 156/292 |
| 5,221,982 A | 6/1993 | Faris ........................... 359/93 |
| 5,224,088 A | 6/1993 | Atiya .......................... 369/97 |
| D337,320 S | 7/1993 | Hunter et al. ............. D14/113 |
| 5,226,099 A | 7/1993 | Mignardi et al. ............ 385/19 |
| 5,229,597 A | 7/1993 | Fukatsu |
| 5,230,005 A | 7/1993 | Rubino et al. ............... 372/20 |
| 5,231,363 A | 7/1993 | Sano et al. ................. 332/109 |
| 5,231,388 A | 7/1993 | Stoltz ....................... 340/783 |
| 5,231,432 A | 7/1993 | Glenn ........................ 353/31 |
| 5,233,456 A | 8/1993 | Nelson ..................... 359/214 |
| 5,233,460 A | 8/1993 | Partlo et al. ............... 359/247 |
| 5,233,874 A | 8/1993 | Putty et al. ............. 73/517 AV |
| 5,237,340 A | 8/1993 | Nelson ..................... 346/108 |
| 5,237,435 A | 8/1993 | Kurematsu et al. ........... 359/41 |
| 5,239,448 A | 8/1993 | Perkins et al. .............. 361/764 |
| 5,239,806 A | 8/1993 | Maslakow .................... 53/432 |
| 5,240,818 A | 8/1993 | Mignardi et al. ........... 430/321 |
| 5,245,686 A | 9/1993 | Faris et al. ................. 385/120 |
| 5,247,180 A | 9/1993 | Mitcham et al. .......... 250/492.1 |
| 5,247,593 A | 9/1993 | Lin et al. ..................... 385/17 |
| 5,249,245 A | 9/1993 | Lebby et al. ................. 385/89 |
| 5,251,057 A | 10/1993 | Guerin et al. .............. 359/249 |
| 5,251,058 A | 10/1993 | MacArthur ................ 359/249 |
| 5,254,980 A | 10/1993 | Hendrix et al. .............. 345/84 |
| 5,255,100 A | 10/1993 | Urbanus .................... 358/231 |
| 5,256,869 A | 10/1993 | Lin et al. ................. 250/201.9 |
| 5,258,325 A | 11/1993 | Spitzer et al. ................ 437/86 |
| 5,260,718 A | 11/1993 | Rommelmann et al. 346/107 R |
| 5,260,798 A | 11/1993 | Um et al. ................... 358/233 |
| 5,262,000 A | 11/1993 | Welbourn et al. .......... 156/643 |
| 5,272,473 A | 12/1993 | Thompson et al. ............ 345/7 |
| 5,278,652 A | 1/1994 | Urbanus et al. ............ 358/160 |
| 5,278,925 A | 1/1994 | Boysel et al. ................. 385/14 |
| 5,280,277 A | 1/1994 | Hornbeck .................. 345/108 |
| 5,281,887 A | 1/1994 | Engle ......................... 310/335 |
| 5,281,957 A | 1/1994 | Schoolman ................... 345/8 |
| 5,285,105 A | 2/1994 | Cain .......................... 257/672 |
| 5,285,196 A | 2/1994 | Gale, Jr. .................... 345/108 |
| 5,285,407 A | 2/1994 | Gale et al. ............. 365/189.11 |
| 5,287,096 A | 2/1994 | Thompson et al. ......... 345/147 |
| 5,287,215 A | 2/1994 | Warde et al. ............... 359/293 |
| 5,289,172 A | 2/1994 | Gale, Jr. et al. ............ 345/108 |
| 5,291,317 A | 3/1994 | Newswanger ................ 359/15 |
| 5,291,473 A | 3/1994 | Pauli ......................... 369/112 |
| 5,293,511 A | 3/1994 | Poradish et al. ............ 257/434 |
| 5,296,408 A | 3/1994 | Wilbarg et al. ............. 437/203 |
| 5,296,891 A | 3/1994 | Vogt et al. .................... 355/67 |
| 5,296,950 A | 3/1994 | Lin et al. ....................... 359/9 |
| 5,298,460 A | 3/1994 | Nishiguchi et al. ......... 437/183 |
| 5,299,037 A | 3/1994 | Sakata ........................ 359/41 |
| 5,299,289 A | 3/1994 | Omae et al. .................. 359/95 |
| 5,300,813 A | 4/1994 | Joshi et al. ................. 257/752 |
| 5,301,062 A | 4/1994 | Takahashi et al. .......... 359/567 |
| 5,303,043 A | 4/1994 | Glenn ......................... 348/40 |
| 5,303,055 A | 4/1994 | Hendrix et al. ............. 348/761 |
| 5,307,056 A | 4/1994 | Urbanus .................... 340/189 |
| 5,307,185 A | 4/1994 | Jones et al. .................. 359/41 |
| 5,310,624 A | 5/1994 | Ehrlich ..................... 430/322 |
| 5,311,349 A | 5/1994 | Anderson et al. ........... 359/223 |
| 5,311,360 A | 5/1994 | Bloom et al. ............... 359/572 |
| 5,312,513 A | 5/1994 | Florence et al. ............ 156/643 |
| 5,313,479 A | 5/1994 | Florence ..................... 372/26 |
| 5,313,648 A | 5/1994 | Ehlig et al. ................. 395/800 |
| 5,313,835 A | 5/1994 | Dunn .......................... 73/505 |
| 5,315,418 A | 5/1994 | Sprague et al. .............. 359/41 |
| 5,315,423 A | 5/1994 | Hong ........................ 359/124 |
| 5,315,429 A | 5/1994 | Abramov |
| 5,319,214 A | 6/1994 | Gregory et al. .......... 250/504 R |
| 5,319,668 A | 6/1994 | Luecke ...................... 372/107 |
| 5,319,789 A | 6/1994 | Ehlig et al. ................. 395/800 |
| 5,319,792 A | 6/1994 | Ehlig et al. ................. 395/800 |
| 5,320,709 A | 6/1994 | Bowden et al. |
| 5,321,416 A | 6/1994 | Bassett et al. ................. 345/8 |
| 5,323,002 A | 6/1994 | Sampsell et al. ......... 250/252.1 |
| 5,323,051 A | 6/1994 | Adams et al. .............. 257/417 |
| 5,325,116 A | 6/1994 | Sampsell ................... 346/108 |
| 5,327,286 A | 7/1994 | Sampsell et al. ........... 359/561 |
| 5,329,289 A | 7/1994 | Sakamoto et al. .......... 345/126 |
| 5,330,301 A | 7/1994 | Brancher ................... 414/417 |
| 5,330,878 A | 7/1994 | Nelson ...................... 430/311 |
| 5,331,454 A | 7/1994 | Hornbeck .................. 359/224 |
| 5,334,991 A | 8/1994 | Wells et al. ................... 345/8 |
| 5,339,116 A | 8/1994 | Urbanus et al. ............ 348/716 |
| 5,339,177 A | 8/1994 | Jenkins et al. ................ 359/35 |

| Patent | Date | Inventor | Class |
|---|---|---|---|
| 5,340,772 A | 8/1994 | Rosotker | 437/226 |
| 5,345,521 A | 9/1994 | McDonald et al. | 385/19 |
| 5,347,321 A | 9/1994 | Gove | 348/663 |
| 5,347,378 A | 9/1994 | Handschy et al. | 359/53 |
| 5,347,433 A | 9/1994 | Sedlmayr | 362/32 |
| 5,348,619 A | 9/1994 | Bohannon et al. | 156/664 |
| 5,349,687 A | 9/1994 | Ehlig et al. | 395/800 |
| 5,351,052 A | 9/1994 | D'Hont et al. | 342/42 |
| 5,352,926 A | 10/1994 | Andrews | 257/717 |
| 5,354,416 A | 10/1994 | Okudaira | 156/643 |
| 5,357,369 A | 10/1994 | Pilling et al. | 359/462 |
| 5,357,803 A | 10/1994 | Lane | 73/517 B |
| 5,359,349 A | 10/1994 | Jambor et al. | 345/168 |
| 5,359,451 A | 10/1994 | Gelbart et al. | 359/285 |
| 5,361,131 A | 11/1994 | Tekemori et al. | 356/355 |
| 5,363,220 A | 11/1994 | Kuwayama et al. | 359/3 |
| 5,365,283 A | 11/1994 | Doherty et al. | 348/743 |
| 5,367,585 A | 11/1994 | Ghezzo et al. | 385/23 |
| 5,370,742 A | 12/1994 | Mitchell et al. | 134/10 |
| 5,371,543 A | 12/1994 | Anderson | 348/270 |
| 5,371,618 A | 12/1994 | Tai et al. | 359/53 |
| 5,377,705 A | 1/1995 | Smith, Jr. et al. | 134/95.3 |
| 5,382,961 A | 1/1995 | Gale, Jr. | 345/108 |
| 5,387,924 A | 2/1995 | Gale, Jr. et al. | 345/108 |
| 5,389,182 A | 2/1995 | Mignardi | 156/344 |
| 5,391,881 A | 2/1995 | Jeuch et al. | 250/370.09 |
| 5,392,140 A | 2/1995 | Ezra et al. | 359/41 |
| 5,392,151 A | 2/1995 | Nelson | 359/223 |
| 5,394,303 A | 2/1995 | Yamaji | 361/749 |
| 5,398,071 A | 3/1995 | Gove et al. | 348/558 |
| 5,399,898 A | 3/1995 | Rostoker | 257/499 |
| 5,404,365 A | 4/1995 | Hiiro | 372/27 |
| 5,404,485 A | 4/1995 | Ban | 395/425 |
| 5,408,123 A | 4/1995 | Murai | 257/531 |
| 5,410,315 A | 4/1995 | Huber | 342/42 |
| 5,411,769 A | 5/1995 | Hornbeck | 427/534 |
| 5,412,186 A | 5/1995 | Gale | 219/679 |
| 5,412,501 A | 5/1995 | Fisli | 359/286 |
| 5,418,584 A | 5/1995 | Larson | 353/122 |
| 5,420,655 A | 5/1995 | Shimizu | 353/33 |
| 5,420,722 A | 5/1995 | Bielak | 359/708 |
| 5,426,072 A | 6/1995 | Finnila | 437/208 |
| 5,427,975 A | 6/1995 | Sparks et al. | 437/79 |
| 5,430,524 A | 7/1995 | Nelson | 355/200 |
| 5,435,876 A | 7/1995 | Alfaro et al. | 156/247 |
| 5,438,477 A | 8/1995 | Pasch | 361/689 |
| 5,439,731 A | 8/1995 | Li et al. | 428/209 |
| 5,442,411 A | 8/1995 | Urbanus et al. | 348/771 |
| 5,442,414 A | 8/1995 | Janssen et al. | 353/98 |
| 5,444,566 A | 8/1995 | Gale et al. | 359/291 |
| 5,445,559 A | 8/1995 | Gale et al. | 451/388 |
| 5,446,479 A | 8/1995 | Thompson et al. | 345/139 |
| 5,447,600 A | 9/1995 | Webb | 216/2 |
| 5,448,314 A | 9/1995 | Heimbuch et al. | 348/743 |
| 5,448,546 A | 9/1995 | Pauli | 369/112 |
| 5,450,088 A | 9/1995 | Meier et al. | 342/51 |
| 5,450,219 A | 9/1995 | Gold et al. | 359/40 |
| 5,451,103 A | 9/1995 | Hatanaka et al. | 353/31 |
| 5,452,024 A | 9/1995 | Sampsell | 348/755 |
| 5,452,138 A | 9/1995 | Mignardi et al. | 359/855 |
| 5,453,747 A | 9/1995 | D'Hont et al. | 342/42 |
| 5,453,778 A | 9/1995 | Venkateswar et al. | 347/239 |
| 5,453,803 A | 9/1995 | Shapiro et al. | 353/119 |
| 5,454,160 A | 10/1995 | Nickel | 29/840 |
| 5,454,906 A | 10/1995 | Baker et al. | 216/66 |
| 5,455,445 A | 10/1995 | Kurtz et al. | 257/419 |
| 5,455,455 A | 10/1995 | Badehi | 257/690 |
| 5,455,602 A | 10/1995 | Tew | 347/239 |
| 5,457,493 A | 10/1995 | Leddy et al. | 348/164 |
| 5,457,566 A | 10/1995 | Sampsell et al. | 359/292 |
| 5,457,567 A | 10/1995 | Shinohara | 359/305 |
| 5,458,716 A | 10/1995 | Alfaro et al. | 156/245 |
| 5,459,492 A | 10/1995 | Venkateswar | 347/253 |
| 5,459,528 A | 10/1995 | Pettitt | 348/568 |
| 5,459,592 A | 10/1995 | Shibatani et al. | 359/40 |
| 5,459,610 A | 10/1995 | Bloom et al. | 359/572 |
| 5,461,197 A | 10/1995 | Hiruta et al. | 174/52.4 |
| 5,461,410 A | 10/1995 | Venkateswar et al. | 347/240 |
| 5,461,411 A | 10/1995 | Florence et al. | 347/240 |
| 5,461,547 A | 10/1995 | Ciupke et al. | 362/31 |
| 5,463,347 A | 10/1995 | Jones et al. | 330/253 |
| 5,463,497 A | 10/1995 | Muraki et al. | 359/618 |
| 5,465,175 A | 11/1995 | Woodgate et al. | 359/463 |
| 5,467,106 A | 11/1995 | Salomon | 345/87 |
| 5,467,138 A | 11/1995 | Gove | 348/452 |
| 5,467,146 A | 11/1995 | Huang et al. | 348/743 |
| 5,469,302 A | 11/1995 | Lim | 359/846 |
| 5,471,341 A | 11/1995 | Warde et al. | 359/293 |
| 5,473,512 A | 12/1995 | Degani et al. | 361/760 |
| 5,475,236 A | 12/1995 | Yoshizaki | 257/48 |
| 5,480,839 A | 1/1996 | Ezawa et al. | 437/209 |
| 5,481,118 A | 1/1996 | Tew | 250/551 |
| 5,481,133 A | 1/1996 | Hsu | 257/621 |
| 5,482,564 A | 1/1996 | Douglas et al. | 134/18 |
| 5,482,818 A | 1/1996 | Nelson | 430/394 |
| 5,483,307 A | 1/1996 | Anderson | 353/98 |
| 5,485,172 A | 1/1996 | Sawachika et al. | 345/8 |
| 5,485,304 A | 1/1996 | Kaeriyama | 359/291 |
| 5,485,354 A | 1/1996 | Ciupke et al. | 362/31 |
| 5,486,698 A | 1/1996 | Hanson et al. | 250/332 |
| 5,486,841 A | 1/1996 | Hara et al. | 345/8 |
| 5,486,946 A | 1/1996 | Jachimowicz et al. | 359/263 |
| 5,488,431 A | 1/1996 | Gove et al. | 348/716 |
| 5,489,952 A | 2/1996 | Gove et al. | 348/771 |
| 5,490,009 A | 2/1996 | Venkateswar et al. | 359/291 |
| 5,491,510 A | 2/1996 | Gove | 348/77 |
| 5,491,612 A | 2/1996 | Nicewarner, Jr. | 361/760 |
| 5,491,715 A | 2/1996 | Flaxl | 375/344 |
| 5,493,177 A | 2/1996 | Muller et al. | 313/578 |
| 5,493,439 A | 2/1996 | Engle | 359/292 |
| 5,497,172 A | 3/1996 | Doherty et al. | 345/85 |
| 5,497,197 A | 3/1996 | Gove et al. | 348/388 |
| 5,497,262 A | 3/1996 | Kaeriyama | 359/223 |
| 5,499,060 A | 3/1996 | Gove et al. | 348/651 |
| 5,499,062 A | 3/1996 | Urbanus | 348/771 |
| 5,500,761 A | 3/1996 | Goossen et al. | 359/290 |
| 5,502,481 A | 3/1996 | Dentinger et al. | 348/51 |
| 5,504,504 A | 4/1996 | Markandey et al. | 345/214 |
| 5,504,514 A | 4/1996 | Nelson | 347/130 |
| 5,504,575 A | 4/1996 | Stafford | 356/330 |
| 5,504,614 A | 4/1996 | Webb et al. | 359/223 |
| 5,506,171 A | 4/1996 | Leonard et al. | 437/187 |
| 5,506,597 A | 4/1996 | Thompson et al. | 345/85 |
| 5,506,720 A | 4/1996 | Yoon | 359/224 |
| 5,508,558 A | 4/1996 | Robinette, Jr. et al. | 257/700 |
| 5,508,561 A | 4/1996 | Tago et al. | 257/737 |
| 5,508,565 A | 4/1996 | Hatakeyama et al. | 257/777 |
| 5,508,750 A | 4/1996 | Hewlett et al. | 348/558 |
| 5,508,840 A | 4/1996 | Vogel et al. | 359/291 |
| 5,508,841 A | 4/1996 | Lin et al. | 359/318 |
| 5,510,758 A | 4/1996 | Fujita et al. | 333/247 |
| 5,510,824 A | 4/1996 | Nelson | 347/239 |
| 5,512,374 A | 4/1996 | Wallace et al. | 428/422 |
| 5,512,748 A | 4/1996 | Hanson | 250/332 |
| 5,515,076 A | 5/1996 | Thompson et al. | 345/139 |
| 5,516,125 A | 5/1996 | McKenna | 279/3 |
| 5,517,340 A | 5/1996 | Doany et al. | 359/41 |
| 5,517,347 A | 5/1996 | Sampsell | 359/224 |
| 5,517,357 A | 5/1996 | Shibayama | 359/547 |
| 5,517,359 A | 5/1996 | Gelbart | 359/623 |
| 5,519,251 A | 5/1996 | Sato et al. | 257/666 |
| 5,519,450 A | 5/1996 | Urbanus et al. | 348/600 |

| | | | |
|---|---|---|---|
| 5,521,748 A | 5/1996 | Sarraf | 359/321 |
| 5,523,619 A | 6/1996 | McAllister et al. | 257/686 |
| 5,523,628 A | 6/1996 | Williams et al. | 257/777 |
| 5,523,803 A | 6/1996 | Urbanus et al. | 348/771 |
| 5,523,878 A | 6/1996 | Wallace et al. | 359/290 |
| 5,523,881 A | 6/1996 | Florence et al. | 359/561 |
| 5,523,920 A | 6/1996 | Machuga et al. | 361/767 |
| 5,524,155 A | 6/1996 | Weaver | 385/24 |
| 5,526,834 A | 6/1996 | Mielnik et al. | 134/105 |
| 5,534,107 A | 7/1996 | Gray et al. | 156/643.1 |
| 5,534,883 A | 7/1996 | Koh | 345/3 |
| 5,539,422 A | 7/1996 | Heacock et al. | 345/8 |
| 5,544,306 A | 8/1996 | Deering et al. | 395/164 |
| 5,552,635 A * | 9/1996 | Kim et al. | 257/706 |
| 5,554,304 A | 9/1996 | Suzuki | 216/2 |
| 5,576,878 A | 11/1996 | Henck | 359/224 |
| 5,602,671 A | 2/1997 | Hornbeck | 359/224 |
| 5,606,181 A | 2/1997 | Sakuma et al. | 257/88 |
| 5,606,447 A | 2/1997 | Asada et al. | 359/199 |
| 5,610,438 A | 3/1997 | Wallace et al. | 257/682 |
| 5,623,361 A | 4/1997 | Engle | 359/291 |
| 5,629,566 A | 5/1997 | Doi et al. | 257/789 |
| 5,629,801 A | 5/1997 | Staker et al. | 359/572 |
| 5,640,216 A | 6/1997 | Hasegawa et al. | 349/58 |
| 5,658,698 A | 8/1997 | Yagi et al. | 430/11 |
| 5,661,592 A * | 8/1997 | Bornstein et al. | 359/291 |
| 5,661,593 A | 8/1997 | Engle | 359/292 |
| 5,663,817 A | 9/1997 | Frapin et al. | 349/5 |
| 5,668,611 A | 9/1997 | Ernstoff et al. | 348/771 |
| 5,673,139 A | 9/1997 | Johnson | 359/291 |
| 5,677,783 A | 10/1997 | Bloom et al. | 359/224 |
| 5,689,361 A | 11/1997 | Damen et al. | 359/284 |
| 5,691,836 A | 11/1997 | Clark | 359/247 |
| 5,694,740 A | 12/1997 | Martin et al. | 53/431 |
| 5,696,560 A | 12/1997 | Songer | 348/436 |
| 5,699,740 A | 12/1997 | Gelbart | 101/477 |
| 5,704,700 A | 1/1998 | Kappel et al. | 353/31 |
| 5,707,160 A | 1/1998 | Bowen | 400/472 |
| 5,712,649 A | 1/1998 | Tosaki | 345/8 |
| 5,713,652 A | 2/1998 | Zavracky et al. | 353/122 |
| 5,726,480 A | 3/1998 | Pister | 257/415 |
| 5,731,802 A | 3/1998 | Aras et al. | 345/148 |
| 5,734,224 A | 3/1998 | Tagawa et al. | 313/493 |
| 5,742,373 A | 4/1998 | Alvelda | 349/204 |
| 5,744,752 A | 4/1998 | McHerron et al. | 174/52.4 |
| 5,745,271 A | 4/1998 | Ford et al. | 359/130 |
| 5,757,354 A | 5/1998 | Kawamura | 345/126 |
| 5,757,536 A | 5/1998 | Ricco et al. | 359/224 |
| 5,764,280 A | 6/1998 | Bloom et al. | 348/53 |
| 5,768,009 A | 6/1998 | Little | 359/293 |
| 5,770,473 A | 6/1998 | Hall et al. | 438/26 |
| 5,793,519 A | 8/1998 | Furlani et al. | 359/291 |
| 5,798,743 A | 8/1998 | Bloom | 345/90 |
| 5,798,805 A | 8/1998 | Ooi et al. | 349/10 |
| 5,801,074 A | 9/1998 | Kim et al. | 438/125 |
| 5,802,222 A | 9/1998 | Rasch et al. | 385/1 |
| 5,808,323 A | 9/1998 | Spaeth et al. | 257/88 |
| 5,808,797 A | 9/1998 | Bloom et al. | 359/224 |
| 5,815,126 A | 9/1998 | Fan et al. | 345/8 |
| 5,825,443 A | 10/1998 | Kawasaki et al. | 349/95 |
| 5,832,148 A | 11/1998 | Yariv | |
| 5,835,255 A | 11/1998 | Miles | 359/291 |
| 5,835,256 A | 11/1998 | Huibers | 359/291 |
| 5,837,562 A | 11/1998 | Cho | 438/51 |
| 5,841,579 A * | 11/1998 | Bloom et al. | 359/572 |
| 5,841,929 A | 11/1998 | Komatsu et al. | |
| 5,844,711 A | 12/1998 | Long, Jr. | 359/291 |
| 5,847,859 A | 12/1998 | Murata | 359/201 |
| 5,862,164 A | 1/1999 | Hill | 372/27 |
| 5,868,854 A | 2/1999 | Kojima et al. | 134/1.3 |
| 5,886,675 A | 3/1999 | Aye et al. | 345/7 |
| 5,892,505 A | 4/1999 | Tropper | 345/208 |
| 5,895,233 A | 4/1999 | Higashi et al. | 438/107 |
| 5,898,515 A | 4/1999 | Furlani et al. | 359/290 |
| 5,903,243 A | 5/1999 | Jones | 345/7 |
| 5,903,395 A | 5/1999 | Rallison et al. | 359/630 |
| 5,904,737 A | 5/1999 | Preston et al. | 8/158 |
| 5,910,856 A | 6/1999 | Ghosh et al. | 359/291 |
| 5,912,094 A | 6/1999 | Aksyuk et al. | 430/5 |
| 5,912,608 A | 6/1999 | Asada | 335/222 |
| 5,914,801 A | 6/1999 | Dhuler et al. | 359/230 |
| 5,915,168 A | 6/1999 | Salatino et al. | 438/110 |
| 5,919,548 A | 7/1999 | Barron et al. | 428/138 |
| 5,920,411 A | 7/1999 | Duck et al. | 359/127 |
| 5,920,418 A | 7/1999 | Shiono et al. | 359/246 |
| 5,923,475 A | 7/1999 | Kurtz et al. | 359/619 |
| 5,926,309 A | 7/1999 | Little | 359/293 |
| 5,926,318 A | 7/1999 | Hebert | 359/618 |
| 5,942,791 A | 8/1999 | Shorrocks et al. | 257/522 |
| 5,949,390 A | 9/1999 | Nomura et al. | 345/32 |
| 5,949,570 A | 9/1999 | Shiono et al. | 359/291 |
| 5,953,161 A | 9/1999 | Troxell et al. | 359/618 |
| 5,955,771 A | 9/1999 | Kurtz et al. | 257/419 |
| 5,963,788 A | 10/1999 | Barron et al. | 438/48 |
| 5,978,127 A | 11/1999 | Berg | 359/279 |
| 5,982,553 A | 11/1999 | Bloom et al. | 359/627 |
| 5,986,634 A | 11/1999 | Alioshin | 345/126 |
| 5,986,796 A | 11/1999 | Miles | 359/260 |
| 5,995,303 A | 11/1999 | Honguh et al. | 359/708 |
| 5,999,319 A | 12/1999 | Castracane | 359/573 |
| 6,004,912 A | 12/1999 | Gudeman | 508/577 |
| 6,012,336 A | 1/2000 | Eaton et al. | |
| 6,016,222 A | 1/2000 | Setani et al. | 359/571 |
| 6,025,859 A | 2/2000 | Ide et al. | 347/135 |
| 6,038,057 A | 3/2000 | Brazas, Jr. et al. | 359/291 |
| 6,040,748 A | 3/2000 | Gueissaz | 335/78 |
| 6,046,840 A | 4/2000 | Huibers | 359/291 |
| 6,055,090 A | 4/2000 | Miles | 359/291 |
| 6,057,520 A | 5/2000 | Goodwin-Johansson | 200/181 |
| 6,061,166 A | 5/2000 | Furlani et al. | 359/254 |
| 6,061,489 A | 5/2000 | Ezra | 385/115 |
| 6,062,461 A | 5/2000 | Sparks et al. | 228/123.1 |
| 6,064,404 A | 5/2000 | Aras et al. | 345/507 |
| 6,069,392 A | 5/2000 | Tai et al. | 257/419 |
| 6,071,652 A | 6/2000 | Feldman et al. | 430/5 |
| 6,075,632 A | 6/2000 | Braun | 359/124 |
| 6,084,626 A | 7/2000 | Ramanujan et al. | 347/239 |
| 6,088,102 A | 7/2000 | Manhart | 356/354 |
| 6,090,717 A | 7/2000 | Powell et al. | 438/710 |
| 6,091,521 A | 7/2000 | Popovich | 359/15 |
| 6,096,576 A | 8/2000 | Corbin et al. | 438/108 |
| 6,096,656 A | 8/2000 | Matzke et al. | |
| 6,097,352 A | 8/2000 | Zavracky et al. | 345/7 |
| 6,101,036 A | 8/2000 | Bloom | 359/567 |
| 6,115,168 A | 9/2000 | Zhao et al. | 359/247 |
| 6,122,299 A | 9/2000 | DeMars et al. | 372/20 |
| 6,123,985 A | 9/2000 | Robinson et al. | 427/162 |
| 6,124,145 A | 9/2000 | Stemme et al. | 438/26 |
| 6,130,770 A | 10/2000 | Bloom | 359/224 |
| 6,144,481 A | 11/2000 | Kowarz et al. | 359/291 |
| 6,147,789 A | 11/2000 | Gelbart | 359/291 |
| 6,154,259 A | 11/2000 | Hargis et al. | 348/756 |
| 6,154,305 A | 11/2000 | Dickensheets et al. | |
| 6,163,026 A | 12/2000 | Bawolek et al. | 250/351 |
| 6,163,402 A | 12/2000 | Chou et al. | 359/443 |
| 6,169,624 B1 | 1/2001 | Godil et al. | 359/237 |
| 6,172,796 B1 | 1/2001 | Kowarz et al. | 359/290 |
| 6,172,797 B1 | 1/2001 | Huibers | 359/291 |
| 6,177,980 B1 | 1/2001 | Johnson | 355/67 |
| 6,181,458 B1 * | 1/2001 | Brazas et al. | 359/290 |
| 6,188,519 B1 | 2/2001 | Johnson | 359/572 |
| 6,195,196 B1 | 2/2001 | Kimura et al. | 359/295 |

| | | | | | | | |
|---|---|---|---|---|---|---|---|
| 6,197,610 B1 | 3/2001 | Toda | 438/50 | EP | 0 417 039 A1 | 3/1991 | G03B/21/20 |
| 6,210,988 B1 | 4/2001 | Howe et al. | 438/50 | EP | 0 423 513 A2 | 4/1991 | H01S/3/085 |
| 6,215,579 B1 | 4/2001 | Bloom et al. | 359/298 | EP | 0 436 738 A1 | 7/1991 | H04N/5/74 |
| 6,219,015 B1 | 4/2001 | Bloom et al. | 345/87 | EP | 0 458 316 A2 | 11/1991 | G06K/11/06 |
| 6,222,954 B1 | 4/2001 | Riza | 385/18 | EP | 0 477 566 A2 | 4/1992 | G02B/26/08 |
| 6,229,650 B1 | 5/2001 | Reznichenko et al. | 359/566 | EP | 0 488 326 A3 | 6/1992 | G09G/3/28 |
| 6,229,683 B1 | 5/2001 | Goodwin-Johansson | 361/233 | EP | 0 499 566 A2 | 8/1992 | G06F/3/033 |
| 6,241,143 B1 | 6/2001 | Kuroda | 228/110.1 | EP | 0 528 646 A1 | 2/1993 | G09G/3/02 |
| 6,249,381 B1 | 6/2001 | Suganuma | | EP | 0 530 760 A2 | 3/1993 | G09G/3/34 |
| 6,251,842 B1 | 6/2001 | Gudeman | 508/577 | EP | 0 550 189 A1 | 7/1993 | G02F/1/315 |
| 6,252,697 B1 | 6/2001 | Hawkins et al. | 359/290 | EP | 0 610 665 A1 | 8/1994 | G09G/3/34 |
| 6,254,792 B1 | 7/2001 | Van Buskirk et al. | 216/13 | EP | 0 627 644 A2 | 12/1994 | G02B/27/00 |
| 6,261,494 B1 | 7/2001 | Zavracky et al. | 264/104 | EP | 0 627 850 A1 | 12/1994 | H04N/5/64 |
| 6,268,952 B1 | 7/2001 | Godil et al. | 359/291 | EP | 0 643 314 A2 | 3/1995 | G02B/27/00 |
| 6,271,145 B1 | 8/2001 | Toda | 438/706 | EP | 0 654 777 A1 | 5/1995 | G09G/3/34 |
| 6,271,808 B1 | 8/2001 | Corbin | 345/7 | EP | 0 658 868 A1 | 6/1995 | G09G/3/34 |
| 6,274,469 B1 | 8/2001 | Yu | 438/592 | EP | 0 658 830 A1 | 12/1995 | G09G/3/34 |
| 6,282,213 B1 | 8/2001 | Gutin et al. | | EP | 0 689 078 A1 | 12/1995 | G02B/26/08 |
| 6,286,231 B1 | 9/2001 | Bergman et al. | 34/410 | EP | 0 801 319 A1 | 10/1997 | G02B/26/00 |
| 6,290,859 B1 | 9/2001 | Fleming et al. | 216/2 | EP | 0 851 492 A2 | 7/1998 | H01L/23/538 |
| 6,290,864 B1 | 9/2001 | Patel et al. | 216/79 | EP | 1 003 071 A2 | 5/2000 | G03B/27/72 |
| 6,300,148 B1 | 10/2001 | Birdsley et al. | 438/15 | EP | 1 014 143 A1 | 6/2000 | G02B/26/08 |
| 6,303,986 B1 | 10/2001 | Shook | 257/680 | EP | 1 040 927 A2 | 10/2000 | B41J/2/455 |
| 6,310,018 B1 | 10/2001 | Behr et al. | 510/175 | GB | 2 117 564 A | 10/1983 | H01L/25/08 |
| 6,313,901 B1 | 11/2001 | Cacharelis | | GB | 2 118 365 A | 10/1983 | H01L/27/13 |
| 6,323,984 B1 | 11/2001 | Trisnadi | 359/245 | GB | 2 266 385 A | 10/1993 | G02B/23/10 |
| 6,327,071 B1 | 12/2001 | Kimura | 359/291 | GB | 2 296 152 A | 6/1996 | H04N/13/04 |
| 6,342,960 B1 | 1/2002 | McCullough | 359/124 | GB | 2 319 424 A | 5/1998 | H04N/13/04 |
| 6,346,430 B1 | 2/2002 | Raj et al. | | JP | 53-39068 | 4/1978 | H01L/23/12 |
| 6,356,577 B1 | 3/2002 | Miller | 372/107 | JP | 55-111151 | 8/1980 | H01L/27/00 |
| 6,356,689 B1 | 3/2002 | Greywall | 385/52 | JP | 57-31166 | 2/1982 | H01L/23/48 |
| 6,359,333 B1 | 3/2002 | Wood et al. | 257/704 | JP | 57-210638 | 12/1982 | H01L/21/60 |
| 6,384,959 B1 | 5/2002 | Furlani et al. | 359/291 | JP | 60-49638 | 3/1985 | H01L/21/60 |
| 6,387,723 B1 | 5/2002 | Payne et al. | 438/48 | JP | 60-94756 | 5/1985 | H01L/25/04 |
| 6,392,309 B1 | 5/2002 | Wataya et al. | 257/796 | JP | 60-250639 | 12/1985 | H01L/21/58 |
| 6,396,789 B1 | 5/2002 | Guerra et al. | 369/112 | JP | 61-142750 | 6/1986 | H01L/21/60 |
| 6,418,152 B1 | 7/2002 | Davis | | JP | 61-145838 | 7/1986 | H01L/21/60 |
| 6,421,179 B1 | 7/2002 | Gutin et al. | 359/572 | JP | 63-234767 | 9/1988 | H04N/1/04 |
| 6,438,954 B1 | 8/2002 | Goetz et al. | | JP | 63-305323 | 12/1988 | G02F/1/13 |
| 6,445,502 B1 | 9/2002 | Islam et al. | 359/571 | JP | 1-155637 | 6/1989 | H01L/21/66 |
| 6,452,260 B1 | 9/2002 | Corbin et al. | 257/686 | JP | 40-1155637 | 6/1989 | H01L/21/92 |
| 6,466,354 B1 | 10/2002 | Gudeman | 359/247 | JP | 2219092 | 8/1990 | G09G/3/28 |
| 6,479,811 B1 | 11/2002 | Kruschwitz et al. | | JP | 4-333015 | 11/1992 | G02B/27/18 |
| 6,480,634 B1 | 11/2002 | Corrigan | 385/4 | JP | 7-281161 | 10/1995 | G02F/1/1333 |
| 6,497,490 B1 | 12/2002 | Miller | 359/614 | JP | 3288369 | 3/2002 | G02B/26/06 |
| 6,525,863 B1 | 2/2003 | Riza | 359/290 | WO | WO 90/13913 | 11/1990 | H01L/23/10 |
| 6,563,974 B2 | 5/2003 | Agha Riza | 385/1 | WO | WO 92/12506 | 7/1992 | G09F/9/37 |
| 6,565,222 B1 | 5/2003 | Ishii et al. | 359/883 | WO | WO 93/02269 | 2/1993 | E06B/5/10 |
| 6,569,717 B1 | 5/2003 | Murade | | WO | WO 93/09472 | 5/1993 | G03F/7/20 |
| 2001/0019454 A1 | 9/2001 | Tadic-Galeb et al. | 359/649 | WO | WO 93/18428 | 9/1993 | G02B/27/00 |
| 2002/0015230 A1 | 2/2002 | Pilossof et al. | 359/558 | WO | WO 93/22694 | 11/1993 | G02B/5/18 |
| 2002/0021485 A1 | 2/2002 | Pilossof | 359/295 | WO | WO 94/09473 | 4/1994 | G09G/3/34 |
| 2002/0079432 A1 | 6/2002 | Lee et al. | 250/216 | WO | WO 94/29761 | 12/1994 | G02B/27/24 |
| 2002/0105725 A1 | 8/2002 | Sweatt et al. | 359/566 | WO | WO 95/11473 | 4/1995 | G02B/27/00 |
| 2002/0112746 A1 | 8/2002 | DeYoung et al. | 134/36 | WO | WO 96/02941 | 2/1996 | H01L/23/02 |
| 2002/0131228 A1 | 9/2002 | Potter | | WO | WO 96/08031 | 3/1996 | H01J/29/12 |
| 2002/0131230 A1 | 9/2002 | Potter | 361/277 | WO | WO 96/41217 | 12/1996 | G02B/5/18 |
| 2002/0135708 A1 | 9/2002 | Murden et al. | | WO | WO 96/41224 | 12/1996 | G02B/19/00 |
| 2002/0176151 A1 | 11/2002 | Moon et al. | | WO | WO 97/22033 | 6/1997 | G02B/27/22 |
| 2002/0195418 A1 * | 12/2002 | Kowarz et al. | 216/13 | WO | WO 97/26569 | 7/1997 | G02B/5/18 |
| 2002/0196492 A1 | 12/2002 | Trisnadi et al. | | WO | WO 98/05935 | 2/1998 | G01L/9/06 |
| 2003/0056078 A1 | 3/2003 | Johansson et al. | | WO | WO 98/24240 | 6/1998 | H04N/9/31 |
| | | | | WO | WO 98/41893 | 9/1998 | G02B/26/08 |
| FOREIGN PATENT DOCUMENTS | | | | WO | WO 99/07146 | 2/1999 | H04N/7/16 |
| EP | 0 089 044 A2 | 9/1983 | H01L/23/10 | WO | WO 99/12208 | 3/1999 | H01L/25/065 |
| EP | 0 261 901 A2 | 3/1988 | G09G/3/36 | WO | WO 99/23520 | 5/1999 | G02B/26/08 |
| EP | 0 314 437 A1 | 10/1988 | H01L/25/08 | WO | WO 99/34484 | 7/1999 | |
| EP | 0 304 263 A2 | 2/1989 | H01L/25/065 | WO | WO 99/59335 | 11/1999 | H04N/5/765 |
| EP | 0 306 308 A2 | 3/1989 | H04N/3/14 | WO | WO 99/63388 | 12/1999 | G02B/27/22 |
| EP | 0 322 714 A2 | 7/1989 | G02B/5/30 | WO | WO 99/67671 | 12/1999 | G02B/26/08 |
| EP | 0 627 644 A3 | 9/1990 | G02B/27/00 | WO | WO 00/04718 | 1/2000 | H04N/7/167 |

| | | | | |
|---|---|---|---|---|
| WO | WO 00/07225 | 2/2000 | ........... | H01L/21/00 |
| WO | WO 01/04674 A1 | 1/2001 | ............ | G02B/6/12 |
| WO | WO 01/006297 A3 | 1/2001 | ........... | G02B/27/10 |
| WO | WO 01/57581 A3 | 8/2001 | ........... | G02B/27/48 |
| WO | WO 02/025348 A3 | 3/2002 | ........... | G02B/26/02 |
| WO | WO 02/31575 A2 | 4/2002 | ........... | G02B/27/00 |
| WO | WO 02/058111 A2 | 7/2002 | | |
| WO | WO 02/065184 A3 | 8/2002 | ........... | G02B/27/12 |
| WO | WO 02/073286 A2 | 9/2002 | ........... | G02B/26/08 |
| WO | WO 02/084375 A1 | 10/2002 | ........... | G02B/26/08 |
| WO | WO 02/084397 A3 | 10/2002 | ........... | G02B/27/18 |
| WO | WO 03/001281 A1 | 1/2003 | ............. | G02F/1/01 |
| WO | WO 03/001716 A1 | 1/2003 | ............ | H04J/14/02 |
| WO | WO 03/012523 A1 | 2/2003 | ........... | G02B/26/00 |
| WO | WO 03/016965 A1 | 2/2003 | ............ | G02B/5/18 |
| WO | WO 03/023849 A1 | 3/2003 | ........... | H01L/23/02 |
| WO | WO 03/025628 A2 | 3/2003 | | |

OTHER PUBLICATIONS

J. Neff, "Two–Dimensional Spatial Light Modulators: A Tutorial", Proceedings of the IEEE, vol. 78, No. 5 (May 1990), pp. 826–855.

R. Gerhard–Multhaupt, "Viscoelastic Spatial Light Modulators and Schlieren–Optical Systems for HDTV Projection Displays" SPIE vol. 1255 Large Screen Projection Displays 11 (1990), pp. 69–78.

R. Gerhard–Multhaupt, "Light–Valve Technologies for High–Definition Television Projection Displays", Displays vol. 12, No. 3/4 (1991), pp. 115–128.

O. Solgaard, F. Sandejas, and D. Bloom, "Deformable Grating Optical Modulator," Optics Letters, vol. 17, No. 9, May 1, 1992, New York, USA, pp. 688–690.

F. Sandejas, R. Apte, W. Banyai, and D. Bloom, "Surface Microfabrication of Deformable Grating Valve for High Resolution Displays," The 7th International Conference on Solid–State Sensors and Actuators.

P. Alvelda, "High–Efficiency Color Microdisplays," SID 95 Digest, pp. 307–311, 1995.

Worboys et al., "Miniature Display Technology for Integraged Helmut Systems," GEC Journal of Research, vol. 10, No. 2, pp. 111–118, Chelmsford, Essex, GB 1993.

M. Fan et al., "Color Separation by use of Binary Optics," Optics Letters, vol. 18:15 pp. 1214–1216, (1993).

P. Alvelda, "VLSI Microdisplays and Optoelectric Technology," MIT, pp. 1–93, 1995.

P. Alvelda, "VLSI Microdisplay Technology," Oct. 14, 1994.

D. Rowe, "Laser Beam Scanning," SPIE, vol. 2088, Oct. 5, 1993, 18–26.

L. Hornbeck, "Deformable–Mirror Spatial Light Modulators," Spatial Light Modulators and Applications III, Aug. 8, CA 1989, pp. 86–102.

Russick et al., "Supercritical Carbon Dioxide Extraction of Solvent from Micromachined Structures," Supercritical Fluids, Chapter 18, American Chemical Society, pp 255–269, 1997.

Buhler et al., "Linear Array of Complementary Metal Oxide Semiconductor Double–Pass Metal Micromirrors," Optical Engineering, vol. 36, No. 5, pp 1391–1398, May 1997.

Gani et al., "Variable Gratings for Optical Switching: Rigorous Electromagnetic Simulation and Design," Optical Engineering, vol. 38, No. 3, pp 552–557, Mar. 1999.

R. Tepe, et al. "Viscoelastic Spatial Light Modulator with Active Matrix Addressing," Applied Optics, vol. 28, No. 22, New York, USA, pp. 4826–4834, Nov. 15, 1989.

W. Brinker, et al., "Deformation Behavior of Thin Viscocelastic Layers Used in an Active–Matrix–Addressed Spatial Light Modulator," SPIE vol. 1018, pp. 79–85, Germany, 1988.

T. Utsunomiya and H. Sato, "Electrically Deformable Echellette Grating and its Application to Tunable Laser Resonator," Electronics and Communications in Japan, vol. 63–c, No. 10, pp. 94–100, Japan, 1980.

Burns, D.M. et al., *Development of microelectromechanical variable blaze gratings*, Sensors and Actuators A, pp. 7–15, 1998.

R.N. Thomas, et al., "The Mirror–Matrix Tube: A Novel Light Valve for Projection Displays", IEEE Transactions on Electron Devices, vol. ED–22, No. 9, pp. 765–775, Sep. 1975.

J. Guldberg, et al., " An Aluminum/SiO2/Silicon–on–Sapphire Light Valve Matrix for Projection Displays," Applied Physics Letters, vol. 26, No. 7, pp. 391–393, Apr. 1975.

"Kitchen Computer", IBM Technical Disclosure Bulletin, vol. 37, No. 12, pp. 223–225, Dec. 1994.

"Image Orientation Sensing and Correction for Notepads", Research Disclosure, No. 34788, p. 217, Mar. 1993.

Beck Mason et al., "Directly Modulated Sampled Grating DBR Lasers for Long–Haul WDM Communication Systems" IEEE Photonics Technology Letters, vol. 9, No. 3, Mar. 1997,pp. 377 of 379.

N. J. Frigo et al., "A Wavelength–Division Multiplexed Passive Optical Network with Cost–Shared Components", IEEE Photonics Technology Letters, vol. 6, No. 11, Nov. 1994, pp. 1365 of 1367.

M. S. Goodman et al., "The LAMBDANET Multiwavelength Network: Architecture, Applications, and Demonstrations", IEEE Journal on Selected Areas in Communications, vol. 8, No. 6, Aug. 1990, pp. 995 of 1004.

C.A. Turkatte, "Examining the Benefits of Tunable Lasers for Provisioning Bandwidth on Demand", EuroForum—Optical Components, Feb. 2001, pp. 1 of 10.

R. Plastow, "Tunable Lasers and Future Optical Networks", Forum–Tunable Laser, Aug. 2000, pp. 58 of 62.

Elizabeth Bruce, "Tunable Lasers", Communications, IEEE Spectrum, Feb. 2002, pp. 35 of 39.

M. G. Littman et al., "Spectrally Narrow Pulsed Dye Laser without Beam Expander", Applied Optics, vol. 17, No. 14, Jul. 15, 1978, pp. 2224 of 2227.

Apte et al., "Deformable Grating Light Valves for High Resolution Displays," Solid State Actuator Workshop, Hilton Head, South Carolina, Jun. 13–16, 1994.

Sene et al., "Polysilicon micromechanical gratings for optical modulation," Sensors and Actuators, vol. A57, pp. 145–151, 1996.

Amm et al., "Invited Paper: Grating Light Valve™ Technology: Update and Novel Applications," SID Digest, vol. 29, 1998.

Development of Digital MEMS–Based Display Technology Promises Improved Resolution, Contrast, and Speed, XP–000730009, 1997, pp. 33 of 34.

"Micromachined Opto/Electro/Mechanical Systems," Electronic Systems, NASA Tech Briefs, Mar. 1997, pp. 50 & 52.

S.T. Pai, et al., "Electromigration in Metals", Received Jun. 4, 1976, p. 103–115.

Olga B. Spahn, et al., "High Optical Power Handling of Pop–Up Microelectromechanical Mirros", Sandia National Laboratories, IEEE 2000, p. 51–52.

David M. Burns, et al. "Optical Power Induced Damage to Microelectromechanical Mirrors", Sensors and Actuators A 70, 1998, p. 6–14.

V.S. Aliev et al., "Development of Si(100) surface roughness at the initial stage of etching in F2 and XeF2 gases: ellipsometric study," Surface Science 442 (1999), pp. 206–214.

Xuan–Qi Wang et al., "Gas–Phase Silicon Etching with Bromine Trifluoride," Depart. of Electrical Engineering, 136–93 California Institute of Technology, 1997 IEEE, pp. 1505–1508.

Harold F. Winters, "Etch products from the reaction of XeF2 with SiO2, Si3N4, SiC, and Si in the presence of Ion Bombardment," IBM Research Laboratory, 1983 American Vacuum Society, pp. 927–931.

F.A. Houle, "Dynamics of SiF4 desorption during etching of silicon by XeF2," J. Chem. Phys. 87 (3), Aug. 1, 1987, pp. 1866–1872.

Mehran Mehregany, "Microelectrochemical Systems," 1993 IEEE, pp. 14–22.

D. Moser et al., "A CMOS Compatible Thermally Excited Silicon Oxide Beam Resonator with Aluminium Mirror," Physical Electronics Laboratory, 1991 IEEE, pp. 547–550.

M. Parameswaran et al., "Commercial CMOS Fabricated Integrated Dynamic Thermal Scene Stimulator," 1991 IEEE, pp. 29.4.1–29.4.4.

M. Parameswaran et al., "CMOS Electrothermal Microactuators," Depart. of Electrical Engineering, 1990 IEEE, pp. 128–131.

U. Streller et al., "Selectivity in dry etching of Si(100) with XeF2 and VUV light," Applied Surface Science 106, (1996), pp. 341–346.

M.J.M Vugts et al., "Si/XeF2 etching: Temperature dependence," 1996 American Vacuum Society, pp. 2766–2774.

P. Krummenacher et al., "Smart Temperature Sensor in CMOS Technology," Sensors and Actuators, A–21–A–23 (1990), pp. 636–638.

Henry Baltes, "CMOS as sensor technology," Sensors and Actuators A, 37–38, (1993), pp. 51–56.

Thomas Boltshauser et al., "Piezoresistive Membrane Hygrometers Based on IC Technology," Sensor and Materials, 5, 3, (1993), pp. 125–134.

Z. Parpia et al., "Modelling of CMOS Compatible High Voltage Device Structures," pp. 41–50.

Jon Gildemeister, "Xenon Difluoride Etching System," 1997, UC Berkeley MicroTabrication Manual Chapter 7.15, p. 2–5.

W. Riethmuller et al., "A smart accelerometer with on–chip electronics fabricated by a commercial CMOS process," Sensors and Actuators A. 31, (1992), 121–124.

W. Gopel et al., "Sensors– A Comprehensive Survey," vol. 7, Weinheim New York, 44 pgs.

D. E. Ibbotson et al., "Comparison of XeF2 and F–atom reactions with Si and SiO2," 1984 American Institute of Physics, pp. 1129–1131.

D. E. Ibbotson et al., "Plasmaless dry etching of silicon with fluorine–containing compounds," 1984 American Institute of Physics, pp. 2939–2942.

M.H. Hecht et al., "A novel x–ray photoelectron spectroscopy study of the Al/SiO2 interfaces," 1985 American Institute of Physics, pp. 5256–52616.

Daniel L. Flamm et al., "XeF2 and F–Atom Reactions with Si: Their Significance for Plasma Etching,," Solid State Technology, V. 26, #4, Apr. 1983, pp. 117–121.

H.F. Winters et al., "The etching of silicon with XeF2 vapor," Appl. Phys. Lett. vol. 34, No. 1, Jan. 1979, pp. 70–73.

Wayne Bailey et al., "Microelectronic Structures and Microelectromechanical Devices for Optical Processing and Multimedia Applications," SPIE—The International Society for Optical Engineering, vol. 2641, Oct. 1995, 13 pgs.

J. Marshall et al., "Realizing Suspended Structures on Chips Fabricated by CMOS Foundry Processes Through the MOSIS Service," National Inst. of Standards and Technology, Jun. 94, 63 pgs.

David Moser et al., "CMOS Flow Sensors," 1993 Physical Electronics Lab, Swiss Federal Institute of Tech, Zurich, Switzerland, 195 pgs.

E. Hecht, "Optics", Addison–Wesley, $2^{nd}$ edition, 1987, Adelphi University, pp. 163–169.

E. Hecht, "Optics", Addison–Wesley, $2^{nd}$ edition, 1987, Adelphi University, pp. 358–360.

T. Glaser et al., "Beam switching with binary single–order diffractive grating", XP–000802142, Optics Letters, Dec. 15, 1998, vol. 23, No. 24, pp. 1933 of 1935.

P.C. Kundu et al., "Reduction of Speckle Noise by Varying the Polarisation of Illuminating Beam", XP–002183475, Dept. of Applied Physics, Calcutta University, 1975, pp. 63–67.

J. W. Goodman, "Some Fundamental Properties of Speckle", XP–002181682, Dept. of Electrical Engineering, Stanford University, 1976, pp. 1146–1150.

Lingli Wang et al., "Speckle Reduction in Laser Projection Systems by Diffractive Optical Elements", XP–000754330, Applied Optics, Apr. 1, 1998, vol. 37, No. 10, pp. 1770–1775.

R.W. Corrigan et al., "Calibration of a Scanned Linear Grating Light–Valve, Projection System for E–Cinema Applications", Silicon Light Machines, SID'99, San Jose, CA, 27 pgs., 1999.

R.W. Corrigan et al., "Calibration of a Scanned Linear Grating Light–Valve, Projection System", Silicon Light Machines, San Jose, CA, 4 pgs., May 18, 1999.

"Introduction to Cryptography", http://www.ssh.fi/tech/crpto/into.html, 35 pgs., Jun. 21, 1999.

"Deep Sky Black," Equinox Interscience, www.eisci.com/deepsky.html, 1997.

"Absorptive Neutral Density Filters," Newport Corp., Irvine, CA, www.newport.com, May 7, 1999.

"High Energy Variable Attenuators," Newport Corp., Irvine, CA, www.newport.com, May 7, 1999.

"Neutral–Density Filters," New Focus, Inc., Santa Clara, CA, www.newfocus.com, May 7, 1999.

J. Hawkes et al., "Laser Theory and Practice," Prentice Hall, New York, 1995, pp. 407–408.

C. Tew et al., "Electronic Control of a Digital Micromirror Device for Projection Displays", Proceedings of the 1994 IEEE International Solid–State Circuits Conference, 1994.

Henck, S.A., "Lubrication of Digital Micromirror Devices™", Tribology Letters, No. 3, pp. 239–247, 1997.

K. W. Goossen et al., "Silicon Modulator Based on Mechanically–Active Anti–Reflection Layer with 1 Mbit/sec Capability for Fiber–in–the–Loop Applications", IEEE Protonics Technology Letters, vol. 6, No. 9, Sep. 1994, pp. 1119–1121.

J. A. Walker et al., "Demonstration of a Gain Flattened Optical Amplifier with Micromechanical Equalizer Element", Lucent Technologies, pp. 13–14.

A. P. Payne et al., "Resonance Measurements of Stresses in Al/Si$_3$N$_4$ Micro–Ribbons", Silicon Light Machines, Sep. 22, 1999, 11 pgs.

M. W. Miles, "A New Reflective FPD Technology Using Interferometric Modulation", 4 pgs.

N. A. Riza et al., "Digitally Controlled Fault–Tolerant Multiwavelength Programmable Fiber–Optic Attenuator Using a Two–Dimensional Digital Micromirror Device", Optics Letters, Mar. 1, 1999, vol. 24, No. 5, pp. 282–284.

N. A. Riza et al., "Synchronous Amplitude and Time Control for an Optimum Dynamic Range Variable Photonic Delay Line", Applied Optics, Apr. 10, 1999, vol. 38, No. 11, pp. 2309–2318.

P. Alvelda et al., "44.4; Ferroelectric Microdisplays Using Distortion–Compensated Pixel Layouts", SID 95 DIGEST, XP 2020715, pp. 931–933.

* cited by examiner

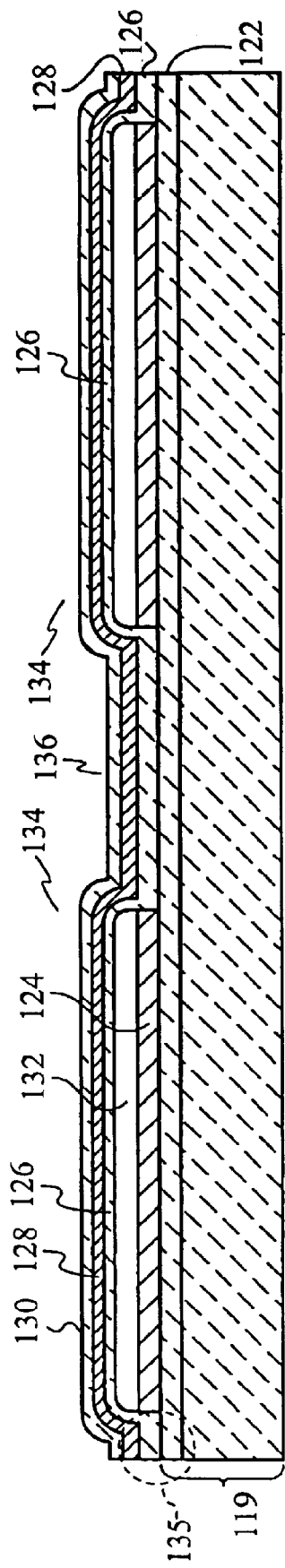
*Fig. 1* (BACKGROUND)
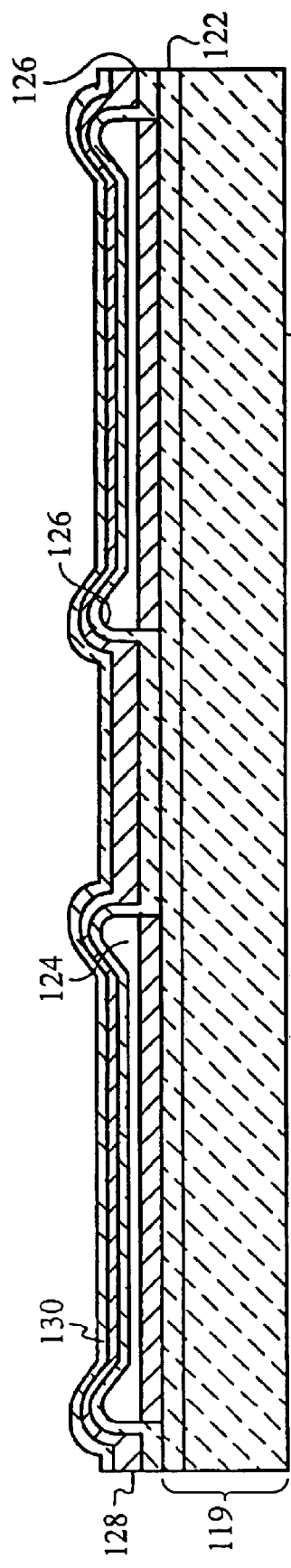
*Fig. 2* (BACKGROUND)

METHOD AND APPARATUS FOR LEVELING THERMAL STRESS VARIATIONS IN MULTI-LAYER MEMS DEVICES

FIELD OF THE INVENTION

The present invention relates to the field of leveling thermal stress and tension variations which develop in MEMS devices comprised of different materials. More particularly, the present invention relates to leveling thermal stress variations within a MEMS device by manipulating the effective thermal coefficient of expansion related stress variations over temperature in a first layered member to approximate the effective thermal coefficient of expansion related stress variations over temperature of a second layered member.

BACKGROUND OF THE INVENTION

MEMS technology involves the process of designing and building micro-sized mechanical and/or electrical structures with technology generally developed for 5V CMOS processes common to IC fabrication. In one area of MEMS device fabrication, typically referred to as surface micromachining, layers of semiconductor, metal, and insulator materials are utilized to build structures which can be activated by electrostatic, electromagnetic, thermal, or pneumatic means, among others. A balancing force to these externally imposed forces is often provided by the mechanical properties of the structures, such as the spring force in deflected beams, bridges, or membrances. Such MEMS devices are projected to be used in areas of biomedical engineering, aerospace, automotive, data storage, or optical telecommunications, where they are used as dispensers, sensors, actuators, read/write heads, or optical signal processing.

FIGS. 1 and 2 illustrate cross sectional views of an embodiment of a grating light valve™ light modulator with movable ribbons. The substrate 119 comprises a silicon layer 120 and a passivating layer 122, such as silicon dioxide. A conducting layer 124 is configured to receive a charge or to be held at ground potential. FIG. 1 illustrates the ribbon 134 in an undeflected state. FIG. 2 illustrates a ribbon 134 in a deflected state. Deflection is typically induced in a ribbon layer 134 by applying a voltage potential to the ribbon 134 with respect to the conducting layer 124, typically by means of a controller circuit.

According to the embodiment illustrated in FIG. 1, the conducting layer 124 is formed on top of the passivating layer 122. The ribbon 134 bridges the conducting layer 124, with an air gap 132 separating the ribbon 134 from the conducting layer 124. Referring to FIGS. 1 and 2, the ribbon 134 comprising a resilient layer 126 which lends tension, flexibility and elasticity to the ribbon structure 134, allowing the ribbon 134 to return to its original position when a deflecting force is removed. The resilient layer 126, also known as the ribbon layer, is typically a stoichiometric silicon nitride layer such as $Si_3N_4$. Tension inherent in the silicon nitride film provides the restoring force to the applied potential force. The resilient layer 126 is typically on the order of about 50–150 nanometers thick in conventional embodiments. The second layer in the ribbon 134, layer 128, is a layer which balances the lateral stress between the nitride layer 126 and the aluminum layer 130, such that in the case of wide ribbons, the curvature after ribbon release is minimized. This layer 128 typically consists of silicon di-oxide, and will be absent for narrow ribbons. Typical oxide layer thicknesses are on the order of about 800 to 2000 nm. The third layer of the ribbon 134 is the aluminum reflecting layer 130, which is deposited against the surface of the silicon oxide 128, or with the absence of the oxide, against the surface of the ribbon nitride 126. The aluminum reflecting layer 130 functions to reflect light for various applications of the grating light valve™ light modulator. The aluminum layer 130 also functions as the complementary capacitor plate, and thus is the electrode that forms one half of the structure across which the field is applied. The aluminum layer 130 is typicaly between about 650 and 1500 nm thick in the conventional embodiments. As noted, an air gap 132 separates the substrate 119 from the ribbon 134. As can be seen in FIGS. 3 and 4, the ribbon layer 126 is bonded to the substrate 122 at an end connection point 135 and/or at a center anchor 136.

The deformable ribbons 134 of grating light valve™ light modulators are representative of a feature common to some MEMS devices. Because most MEMS devices are partly mechanical in nature, they typically involve an electrically or thermally induced mechanical motion of some sort. Moreover, mechanical motion within MEMS devices typically causes elastic material deformation, as illustrated by the ribbons in FIGS. 1 and 2.

The ribbon 134 is fabricated to exhibit an inherent tension defining a natural resonant frequency, and requiring a specific force necessary to deflect the ribbon 134 relative to the substrate surface 119, as illustrated in FIG. 2. Static equilibrium is maintained as the electrostatic force between ribbon 134 and substrate 124 is balanced by the tensile force in ribbon 134. The force between the ribbon 134 and the substrate 119 is transmitted through the end connection point 135 and the center anchor 136 according to the embodiment shown in FIG. 1.

The voltage required to fully deflect the ribbon, known as the switching voltage or pull-down voltage, is typically on the order of about 15–25 volts in certain conventional embodiments. However, the tension within the ribbon across the substrate does not remain constant over a range of temperatures. It typically reduces when the temperature increases and increases as the temperatures decreases. This has a variety of undesirable effects, one of which is that the changing tension causes the pull-down voltage required to fully deflect the ribbon to change as the temperature changes. The fundamental resonance frequency which depends on ribbon characteristics also changes as the tension changes over a range of temperatures. Because damping time is largely a function of the ribbon mass, the damping time remains largely constant in spite of temperature changes, and is typically in the range of about 0–10 $\mu$sec in conventional approaches. There is therefore a desire for a method and apparatus for athermalizing a MEMS design to achieve a constancy of operation over an operational temperature range. More specifically, a desire exists for a method and apparatus for athermalizing the ribbon of a grating light valve™ light modulator to maintain a constancy of tension over an operational temperature range. There is further a desire for a method and apparatus for leveling the deflection voltage of a MEMS device over an operational temperature range. Additionally, there is a desire for leveling the resonant frequency of a MEMS device over an operational temperature range.

SUMMARY OF THE INVENTION

The present invention is directed to a method and apparatus for leveling the aggregate forces within a MEMS structure over an operational temperature range. The present invention is also directed to a method and apparatus for athermalizing a MEMS component to achieve a constancy of operation over an operational temperature range. The present invention is particularly adapted to athermalizing a ribbon in a grating light valve™ light modulator such that it maintains a constancy of tension over an operational temperature range. The present invention is also directed to a method and apparatus for reducing the variations in the deflection force required to deflect a movable MEMS member. The present invention is particularly adapted to reducing the variation in pull-down voltage of a ribbon in a grating light valve™ light modulator over an operational temperature range. The present invention is further directed to reducing variation in the resonant frequency of a movable MEMS member over an operational temperature range.

A MEMS device comprises a first member coupled to a second member, the first member having a first aggregate thermal coefficient of expansion represented by a first value and a second member having a second aggregate thermal coefficient of expansion represented by a second value. A method of athermalizing the MEMS device over an operational temperature range, comprises the step of reducing a difference between the value representing the first aggregate thermal expansion and the second value representing the second aggregate thermal expansion by adjusting the first member to exhibit a third value for its thermal expansion. As an aspect of the present invention, the thermal expansion of the second member is established as a zero coefficient reference value, such that thermal expansion greater than the reference are distinguished by a positive sign, and thermal expansion less than the reference are distinguished by a negative sign. According to one embodiment of the present invention, an athermalization layer comprising a thermal coefficient of expansion whose value has a sign opposite the sign of the first value is added to the first member during a fabrication process. According to an alternative embodiment, a material already present within the first member having a thermal coefficient of expansion with the same sign as the first member is reduced in quantity. The steps of adding an athermalization layer and reducing an amount of an existing material may be used in conjunction.

BRIEF DESCRIPTION OF SEVERAL VIEWS OF THE DRAWINGS

FIG. 1 illustrates a cross sectional view of a grating light valve™ light modulator with ribbons in an undeflected position.

FIG. 2 illustrates a cross sectional view of one embodiment of a grating light valve™ light modulator with ribbons in a deflected position.

DETAILED DESCRIPTION OF THE PREFERRED EMBODIMENTS

U.S. Pat. No. 5,311,360 entitled "METHOD AND APPARATUS FOR MODULATING A LIGHT BEAM" and U.S. Pat. No. 5,841,579 entitled "FLAT DIFFRACTION GRATING LIGHT VALVE" to Bloom et al. and U.S. Pat. No. 5,661,592 entitled "METHOD OF MAKING AN APPARATUS FOR A FLAT DIFFRACTION GRATING LIGHT VALVE" to Bornstein et al., and U.S. Pat. No. 5,808,797 entitled "Method and Apparatus for Modulating a Light Beam" to Bloom, et al. are herein incorporated by reference.

Reference will now be made in detail to the preferred embodiments of the invention, examples of which are illustrated in the accompanying drawings.

Figure 7:
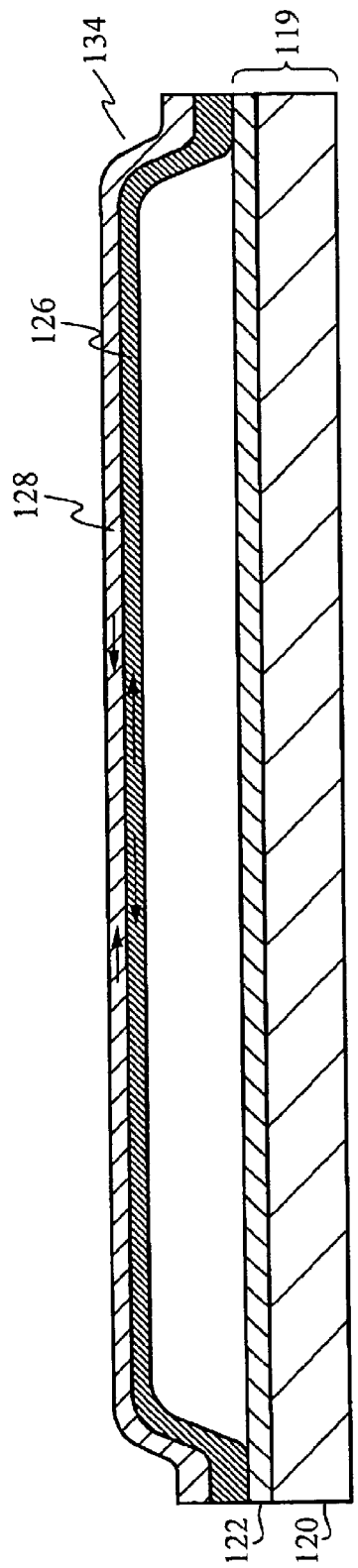
FIG. 7 is a cross sectional illustration of compressive and tensile forces simultaneously present in a single ribbon of a grating light valve™ light modulator.

FIG. 7 is a cross sectional view of a ribbon 134. Arrows present in the layers 126, 128 illustrate that there can be distinct tensile and compressive forces present within the layers 126, 128 of the ribbon 134. Rather, the tension of the ribbon is equal to the sum of the tensions and compressions of the various layers, as illustrated in equation 1:

$$F_{ribbon} = \Sigma(\sigma_{Al} + \sigma_{Si3N4} + \sigma_{Ox}) \quad 1)$$

In equation 1 above, the tension within the ribbon is seen to be equal to the tension within the aluminum layer 128 plus the tension within the resilient layer 126, also known as the ribbon layer, and typically comprised of silicon nitride. In some cases there can be an oxide layer 130 (FIG. 1) whose inherent tension is also added. Those skilled in the art will recognize that the equation is exemplary, and could be adapted for a MEMS structure comprising any number of layers. As applied to grating light valve™ light modulators, the curing and fabrication of the various layers is performed with a view toward ensuring that the sum of the forces in the ribbon yield a predetermined aggregate tension at the reference temperature. Initially, the tension will be examined in terms of the aluminum layer 128 and the resilient layer 126 for purposes of simplicity. As with the aggregation of forces within the ribbon, the multiple layers 120 and 122, of the substrate 119 may be thought of as exerting a single compressive force in resistance to the tensile force of the ribbon. Because most MEMS structures are built on bulk silicon (about 500 μm), the aggregate force is substantially determined by the silicon thermal coefficient of expansion.

Figure 3:
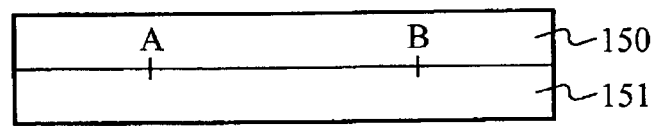
FIG. 3 illustrates a side view of two surfaces of differing thermal coefficients of expansion coupled together.
Figure 4:
FIG. 4 illustrates a side view of two surfaces of differing thermal coefficients of expansion coupled together and bowing as a result of cross boundary thermal stress.
Figure 5:
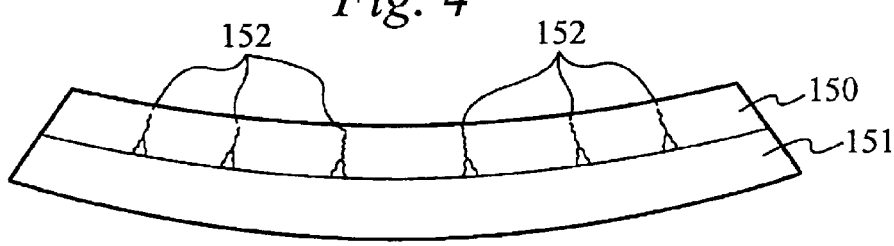
FIG. 5 illustrates a side view of two surfaces of differing thermal coefficients of expansion coupled together wherein one surface is experiencing fissures and fractures as a result of cross-boundary thermal stress.
Figure 6:
FIG. 6 illustrates a side view of two surfaces of differing thermal coefficients of expansion originally coupled together which have undergone delamination as a result of cross-boundary thermal stress.

In addition to the opposing forces of the ribbon and the substrate, those skilled in the art will recognize that stress exists between each layer 126, 128 of the ribbon 134, and between each layer 120, 122 of the substrate 119. Because the various layers have distinct coefficients of thermal expansion, the stress varies as temperature varies. FIG. 3 illustrates two surfaces, 150 and 151 bound together at an optimal temperature selected such that the inter-surface stress is minimized. FIG. 4 illustrates the same surfaces 150 and 151 after the temperature has increased. According to the illustration of FIG. 4, layer 151 has a higher coefficient of thermal expansion than layer 150 and, as the temperature increases, warpage of the layers is seen to occur as layer 151 expands more rapidly than layer 150. FIGS. 5 and 6 illustrate various forms of catastrophic material failure resulting from excessive cross-boundary thermal stress. FIG. 6 illustrates fracture of laminate layer 150 as a result of cross-boundary thermal stress exceeding operational range tolerances. As laminate layer 151 expanded faster than layer 150, the boundary forces create fissures 152 or fractures 152 in the layer expanding more slowly, thus expanding its boundary edge to the same size as the more rapidly expanding edge. FIG. 6 is an exaggerated illustration of delamination, wherein the contact between the surfaces 150 and 151 is broken, forming a gap 152 between the surfaces.

As discussed above, the component layers have different thermal coefficients of expansion. However, when the laminate boundaries of the ribbon 134 and substrate 119 remain intact, it is possible to represent or model the ribbon 134 and the substrate 119 as having a single thermal coefficient of expansion. The process of aggregating the various degrees of thermal expansion comprising the substrate layers 120 and 122, for example, (FIG. 7) takes into account not only the thermal coefficient of expansion of each layer, but the thickness, density, and modulus of elasticity of each of those layers. Therefore, some layers will have a greater contributory effect in determining the "average" or aggregate thermal coefficient of expansion.

This aggregate value is respectively represented by the value $\alpha_{sub}$ for the substrate 119, and by the value $\alpha_{ribbon}$ for the ribbon 134.

As discussed above, the ribbon 134 can be represented as having a single thermal coefficient of expansion, $\alpha_{ribbon}$, which can be determined by weighted averaging of thermal coefficients of expansion of the respective layers $\alpha_{Si3N4}$, $\alpha_{Al}$ and/or $\alpha_{SiO2}$ referring to the thermal coefficients of expansion of the resilient 126, aluminum 128 and/or oxide 130 layers (FIG. 1) of the ribbon 134, respectively. As with the substrate, it is understood that the "averaging" process requires weighing various factors, such as the thickness, modulus, density and tension of various component layers.

Although the relationship of the ribbon 134 to the substrate 119 may advantageously be modeled by representing a single coefficient of expansion for the substrate 119 and the ribbon 134 respectively, some calculations and analyses are advantageously performed by representing the forces and coefficients of expansion in the ribbon layer independently. As noted in equation 1 above, the ribbon tension $\sigma_{ribbon}$ can be represented as a sum of the individual tensions of the component layers, $\Sigma(\sigma_{Al} + \alpha_{Si3N4} + \sigma_{Ox})$. Although the present invention includes alternative embodiments of normalizing the aggregate thermal coefficient of expansion $\alpha_{sub}$ of the substrate 119 to the thermal coefficient of expansion $\alpha_{ribbon}$ of the ribbon 134, the preferred embodiment involves normalizing the thermal coefficient of expansion $\alpha_{ribbon}$ of the ribbon 134 to the substrate $\alpha_{sub}$. In performing analysis according to the preferred embodiment, it is advantageous to normalize the thermal coefficient of expansion of the substrate $\alpha_{sub}$ at the reference value of zero, with thermal coefficient expansions of individual ribbon layers such as $\alpha_{Si3N4}$ and $\alpha_{Al}$ by positive numbers and negative numbers depending on whether their thermal coefficient of expansion is greater or less than $\alpha_{sub}$.

Because the thermal coefficient of expansion $\alpha_{Al}$ of aluminum is greater than the reference $\alpha_{sub}$, being designated by a positive number, as the temperature increases, the aluminum will expand more than the substrate, increasing the compressive component of stress $\sigma_{Al}$ contributed by the aluminum layer 128 within the ribbon 134. By itself, the increasing compressive stress $\sigma_{Al}$ of the aluminum, averaged against the overall tension of the ribbon 134 would have the effect of reducing the tension in the ribbon 134. The resilient layer 126 or ribbon layer, being made of silicon nitride, typically comprises a thermal coefficient of expansion $\alpha_{Si3N4}$ having a negative coefficient with respect to the reference coefficient $\alpha_{SUB}$ of the substrate 119. Accordingly, as the temperature increases, the substrate 119 will expand more than the resilient layer 126. Although the resilient layer 126 is technically expanding, it may therefore be thought of as contracting relative to the substrate, thereby increasing the tensile component of stress $\sigma_{Si3N4}$ within the ribbon 134. As discussed above, however, as long as the surface connection between the aluminum 128 and resilient 126 layers remains intact, the relative expansion of the aluminum layer 128 is partially balanced against the relative contraction of the resilient layer 126. Accordingly, just as the individual tensions could be aggregated according to equation 1, the relative coefficient of thermal expansion can be averaged into a representative coefficient, defining the coefficient of thermal expansion of the ribbon 134 relative to the substrate 119. As discussed above, a representative coefficient of thermal expansion $\alpha_{ribbon}$ of the ribbon 134 must take into consideration not only the component thermal expansion coefficients $\alpha_{Si3N4}$, $\alpha_{Al}$ of the component resilient 126 and aluminum 128 layers of the ribbon 134, but other factors such as the thickness, modulus, and tension of the component layers. Limiting the ribbon to two layers for purposes of simplicity of illustration, a representative or aggregate thermal coefficient of expansion $\alpha_{ribbon}$ of the ribbon 134 can only be given in relation to the variable that is affected, i.e., tension, ribbon resonance frequency, or damping time.

FIG. 7 uses arrows to illustrate the compressive forces in the aluminum layer 128 and the tensile forces in the ribbon layer 126. As discussed above, as long as the boundary between the layers 126 and 128 remains intact, these forces can be aggregated, as illustrated in equation 1 above. As the temperature rises, the ribbon layer 126 is increasing in tension, and the aluminum layer 128 is increasing in compression. Without an athermalization layer according to the present invention, the relative expansion and contraction of the component layers do not average out. Recalling that the thermal coefficient of expansion $\alpha_{Al}$ of the aluminum layer is positive with respect to the substrate and the thermal coefficient of expansion $\alpha_{ribbon}$ of the silicon resilient layer 126 is negative with respect to the substrate, the absolute value of the aluminum coefficient $\alpha_{Al}$ is substantially larger that the absolute value of the silicon nitride coefficient $\alpha_{ribbon}$ of the resilient layer 126. As a result, because layer thicknesses are substantially the same order of magnitude, the relatively high thermal coefficient of expansion $\alpha_{Al}$ of aluminum gives the aluminum layer 128 a disproportionate effect compared with the resilient layer 126. As a consequence, without an athermalization layer, when the temperature increases, the disproportionate growth of the compressive force from the aluminum layer 128 reduces the tension in the ribbon. However, as a ribbon decreases in tension, it exhibits a lower resonant frequency. It also requires less force to deflect, which means that the pull-down voltage is lower. The pull-down voltage is determined by the potential difference between the ribbon and the substrate, required to deflect the ribbon to a fully deflected position, which in this case is about 30% of the full space between the undeflected ribbon and the substrate. Accordingly, the difference in the thermal coefficients of expansion of the substrate $\alpha_{sub}$ and the ribbon $\alpha_{ribbon}$ results in a ribbon that exhibits a constantly changing resonant frequency and a constantly changing pull-down voltage over a range of temperatures. However, with many MEMS devices, operational consistency over a wide range of temperatures is often desirable. This is particularly true with respect to the control of the ribbons in a grating light valve™ light modulator. Other MEMS devices similarly depend on a constancy of behavior.

Figure 8:
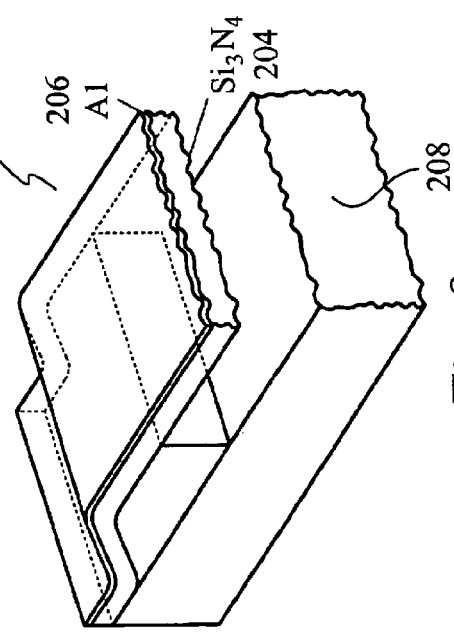
FIG. 8 illustrates a perspective view of a grating light valve™ light modulator comprising reduced thickness of the aluminum layer and increased thickness of the resilient layer.

FIG. 8 illustrates an athermalization layer comprising a decreased-aluminum/increased-resilient-layer embodiment of a grating light valve™ light modulator ribbon according to the present invention. The aluminum layer of a grating light valve™ light modulator functions to reflect the incident electromagnetic waves, specifically in the visible and near IR region or the preferred embodiment. According to this embodiment, the aluminum layer is reduced to a thickness in the range of about 40 to 65 nanometers. Because the thickness of a layer is proportional to the effect it has on the aggregate thermal coefficient of expansion of the ribbon $\alpha_{ribbon}$, by reducing the thickness of the aluminum layer 206, the aggregate thermal coefficient of expansion of the ribbon $\alpha_{rib}$ is reduced, thereby normalizing the aggregate thermal coefficient of expansion of the ribbon $\alpha_{rib}$ to the thermal coefficient of expansion $\alpha_{sub}$ of the substrate 208.

The lower limit of Aluminum thickness is determined mostly by process conditions. Thin aluminum often suffers from voiding (sections of aluminum disappear) or hillocking (aluminum tends to bunch up at specific locations). At the same time, reflectivity will reduce at low aluminum thickness, resulting in unacceptable device performance. However, thicknesses below 40 nanometers are not likely to serve most purposes, and a thickness of about 45 to 60 nanometers is generally preferred.

As discussed above, using the thermal coefficient of expansion $\alpha_{sub}$ of the substrate 208 as a reference of zero, the thermal coefficient of expansion of the aluminum layer 206 is positive, and the thermal coefficient of expansion $\alpha_{Si3N4}$ of the resilient layer 204 is negative. Accordingly, athermalization may be achieved by thinning the aluminum layer 206, increasing the thickness of the resilient layer 204, or both. Because a reduction of the thickness of the aluminum layer sufficient to reach athermalization between the ribbon and substrate would leave the aluminum layer 206 too thin for many applications, to athermalize the ribbon 202 with respect to the substrate, in conjunction with the thinning of the aluminum layer 206, the thickness of the resilient layer 204 can be adjusted to assure maximum aluminum reflectivity. At the proper relative values, the combination of thinning the aluminum layer and thickening the silicon nitride layer has the effect of athermalizating the ribbon 202. Although either the aluminum thickness or the silicon nitride thickness may be considered as the independent variable, for purposes of uniformity and simplicity, the aluminum thickness is herein presented as an independent variable, and the silicon nitride thickness is presented as a "compensating" thickness or dependent variable.

The contributory effect of the resilient layer 204 on the aggregate thermal expansion of the ribbon 202 is roughly proportional to the thickness of the resilient layer 204. Accordingly, by increasing the thickness of the resilient layer 204 to a thickness in the range of about 150 to 250 nanometer range, in conjunction with the thinning of the aluminum layer 206, the aggregate thermal coefficient of expansion $\alpha_{ribbon}$ of the ribbon is athermalized with respect to the thermal coefficient of expansion $\alpha_{sub}$ of the substrate 208. Again, however, there are practical limits to the thickness which is sustainable by the resilient layer 204. The resilient layer 204 is comprised of a resilient material such as Low Pressure Chemical Vapor Deposited Silicon Nitride (LPCVD), which exhibits an elasticity and resiliency, such that it seeks to restore the ribbon to an undeflected position when the pull-down voltage is turned off. Accordingly, the process of thickening the resilient layer 204 makes the ribbon 202 more difficult to deflect, and a higher pull down voltage is required. In most applications, the requirement of a higher voltage to achieve full deflection is a disadvantage.

Figure 9:
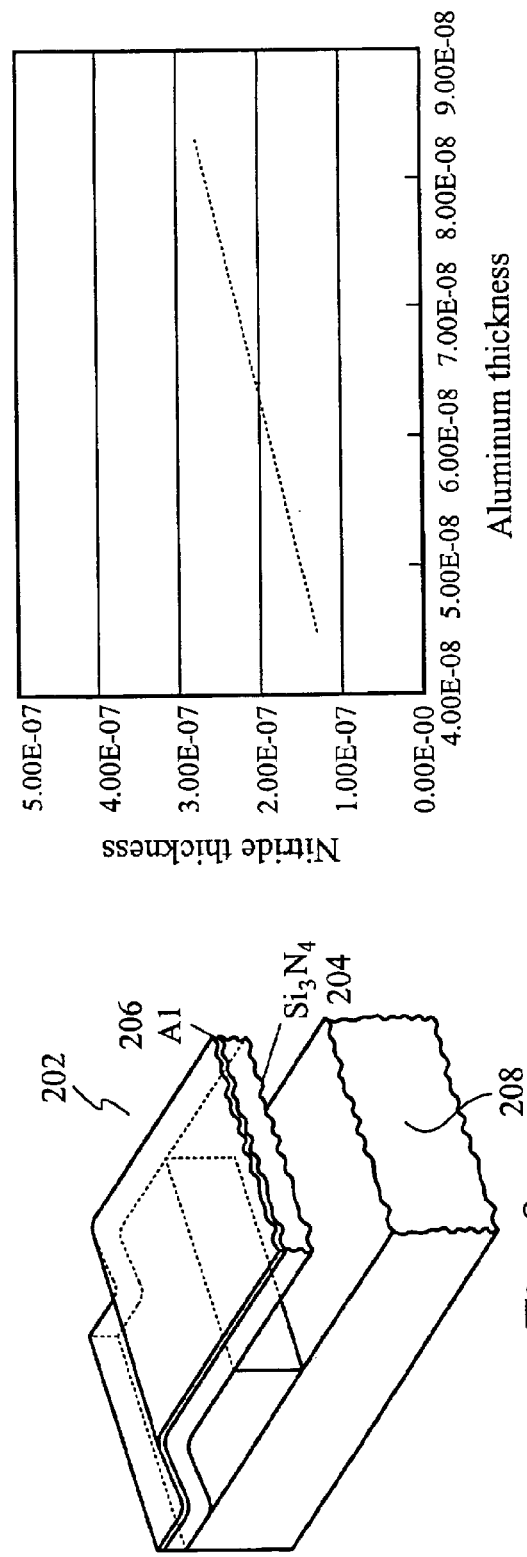
FIG. 9 graphically illustrates aluminum thickness as a function of resilient layer thickness at athermalization.

FIG. 9 graphically illustrates the athermalization curve for various thickness of the silicon nitride layer in comparison to the aluminum layer. As illustrated by the graph, at an aluminum thickness of approximately 55 nm, the silicon nitride layer configured to athermalize the ribbon 202 with respect to the substrate 208 is approximately 175 nm thick. FIG. 9 shows that the thickness of the aluminum layer and the resilient layer can vary according to circumstances. The advantages of reducing the thickness of the aluminum layer can be seen by examining the behavioral characteristics of this embodiment illustrated in FIGS. 10–12. The pull-down voltage, damping time and resonance frequency are illustrated as a function of aluminum thickness. No silicon nitride thickness is illustrated in these graphs, but the graphs represent behavioral characteristics at athermalization, the athermalized relationship between the aluminum 206 and resilient silicon nitride 204 layers being illustrated in FIG. 9. Accordingly, the relationship of aluminum to silicon nitride illustrated in FIG. 9 is operational for FIGS. 10–12.

Figure 10:
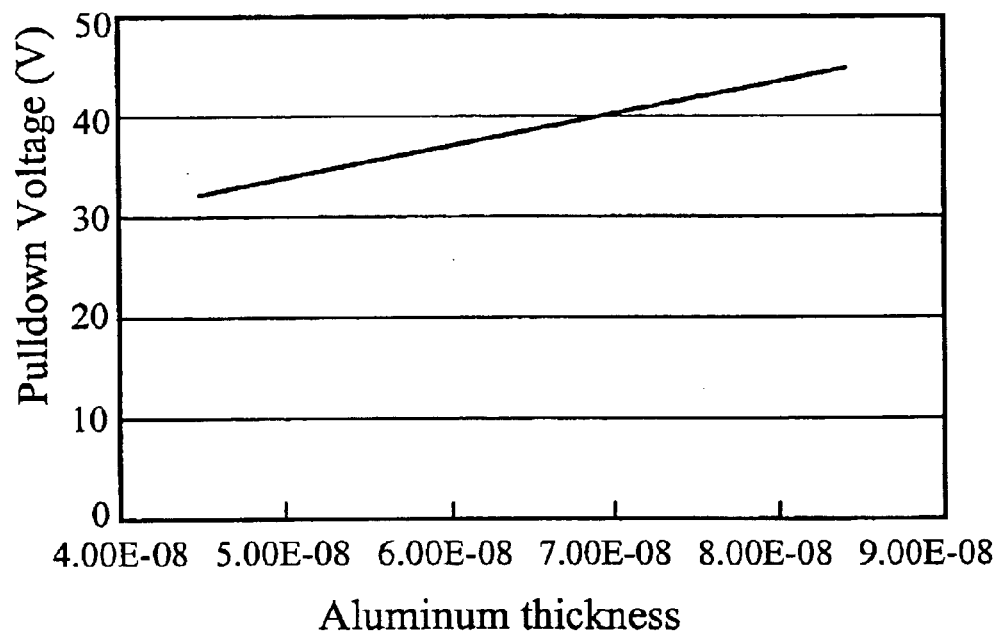
FIG. 10 graphically illustrates the pull-down voltage as a function of aluminum thickness at athermalization according to FIG. 9.

According to FIG. 10, at an aluminum thickness of 55 nm the required pull down voltage is approximately 35 volts. This appears to be a result that the tensile strength of the ribbon 202 is increased by thickening the resilient layer 204 sufficient to athermalize the ribbon 202. As FIG. 10 illustrates, the pull down voltage according to this embodiment traverses a voltage range from about 32 volts to 42 volts corresponding to a respective range of aluminum thickness of about 45 nanometers to 85 nanometers. For comparative purposes, these values can be contrasted to ribbons which are not athermalized, which exhibit a pull-down voltage typically on the order of about 20 volts.

Another effect of the decreased-aluminum/increased-resilient-layer embodiment is that, by increasing the thickness of the resilient layer, the mass of the ribbon is increased, making it more resistant to the damping effects of the air or gas it engages during oscillation. Depending on the aluminum thickness and corollary resilient layer thickness, the damping time increases by approximately 50%.

Figure 11:
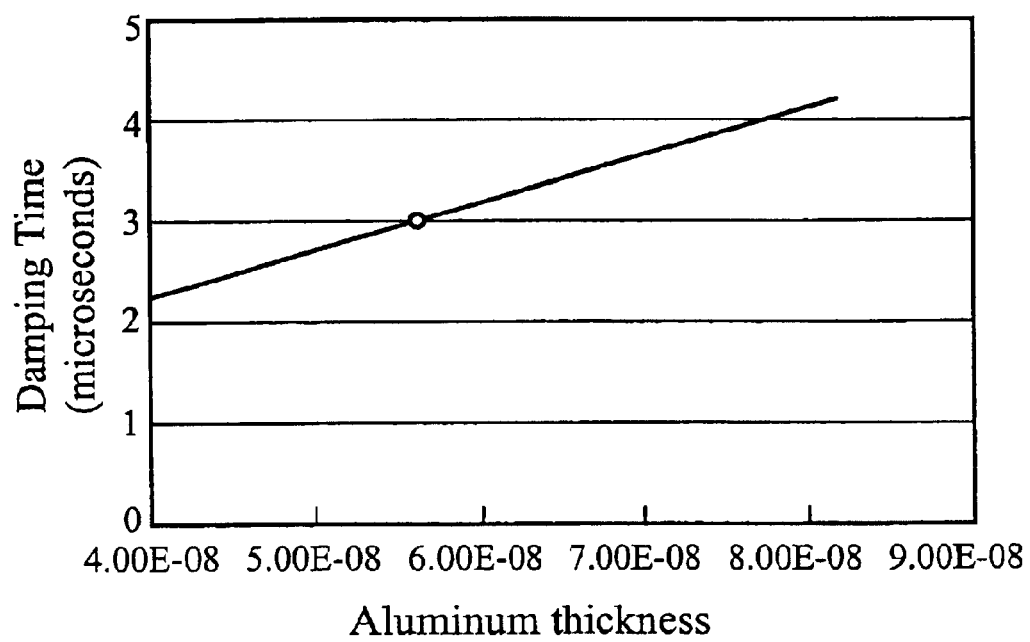
FIG. 11 graphically illustrates the damping time constant as a function of aluminum thickness at athermalization according to FIG. 9.

FIG. 11 graphically illustrates the relationship between damping time and aluminum thickness at athermalization. At approximately 55 nm aluminum thickness, damping time is roughly 3 microseconds. As the aluminum thickness increases, the silicon nitride thickness is also increased. As graphically illustrated, the increased mass resulting from a thicker resilient layer is seen to have a corollary increase in damping times. At an aluminum thickness of about 70 nm, damping time is approximately 4 microseconds.

Figure 12:
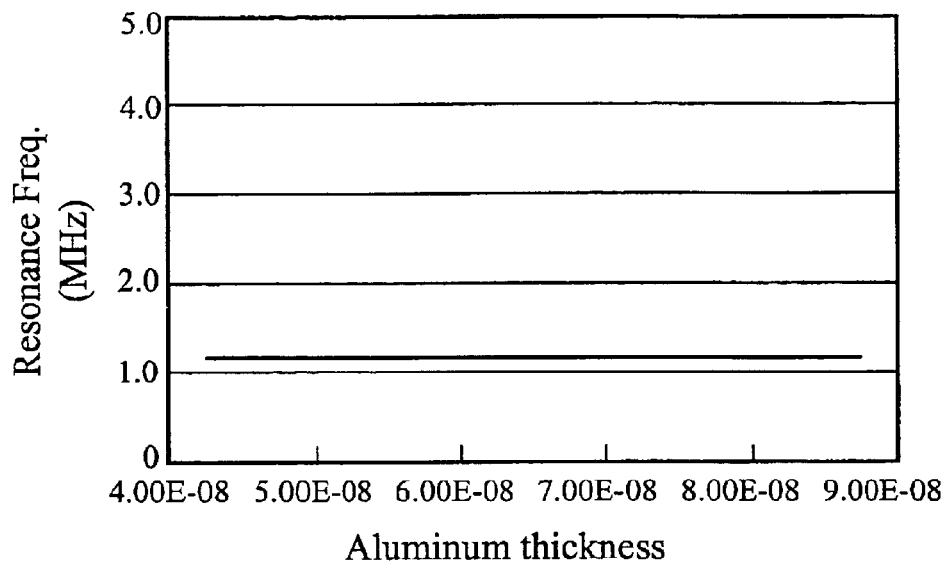
FIG. 12 graphically illustrates the resonance frequency of the ribbon as a function of aluminum thickness at athermalization according to FIG. 9.

FIG. 12 graphically illustrates a level resonance frequency at approximately 1.14 MHz over the range of aluminum thicknesses illustrated within the graph, independent of the layer thickness.

Figure 13:
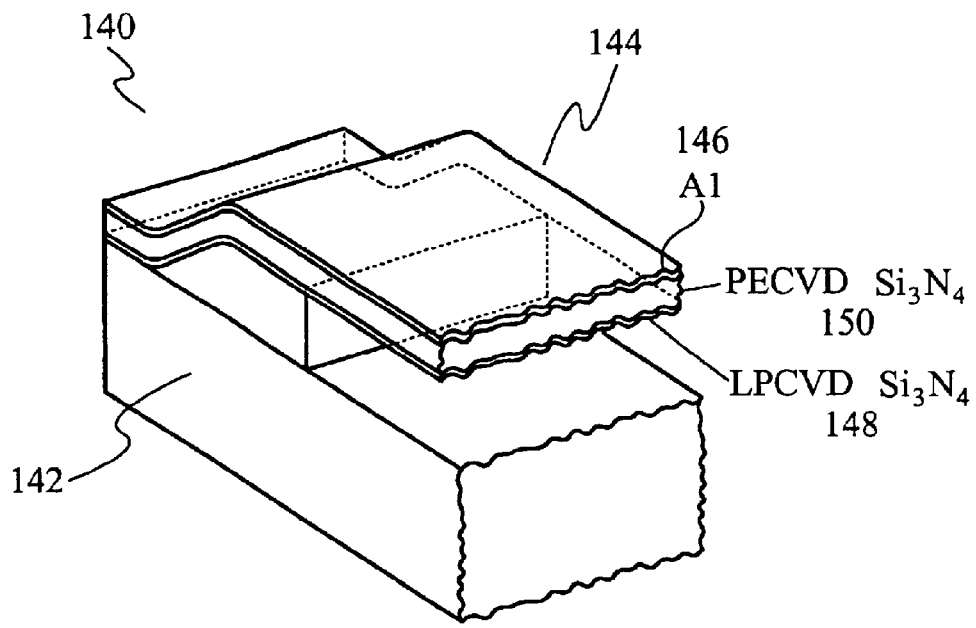
FIG. 13 is a perspective view illustrating a grating light valve™ light modulator comprising a ribbon with a PECVD layer disposed between the resilient layer and the reflective layer.

The athermalization layer of the decreased-aluminum/ increased-resilient-layer embodiment discussed above comprises an increase in the thickness of the resilient layer to athermalize the ribbon with respect to the substrate. The resilient layer is advantageously comprised of an LPCVD silcon nitride described earlier. According to one embodiment of the present invention illustrated in FIG. 13, an athermalization layer 150 of Plasma Enhanced Chemical Vapor Deposited "PECVD" silicon nitride is incorporated in the ribbon 144, preferably between the resilient layer 148 and the aluminum layer 146 (FIG. 13). Although the PECVD silicon nitride layer 150 and the low pressure chemical vapor deposited LPCVD silicon nitride layer 148 are both expressed by the chemical formula $Si_3N_4$, the LPCVD silicon nitride used in the ribbon layer 148 has a greater tensile stress and resiliency than the PECVD silicon nitride 150. By using a PECVD silicon nitride layer for athermalization, the PECVD embodiment is capable of athermalizing the ribbon 144 with respect to the substrate 142 without increasing the tension of the ribbon 144 as much as using LPCVD silicon nitride of the increased-resilient-layer embodiment. By using PECVD silicon nitride, the pull down voltage is held to the 28 volts range.

Figure 14:
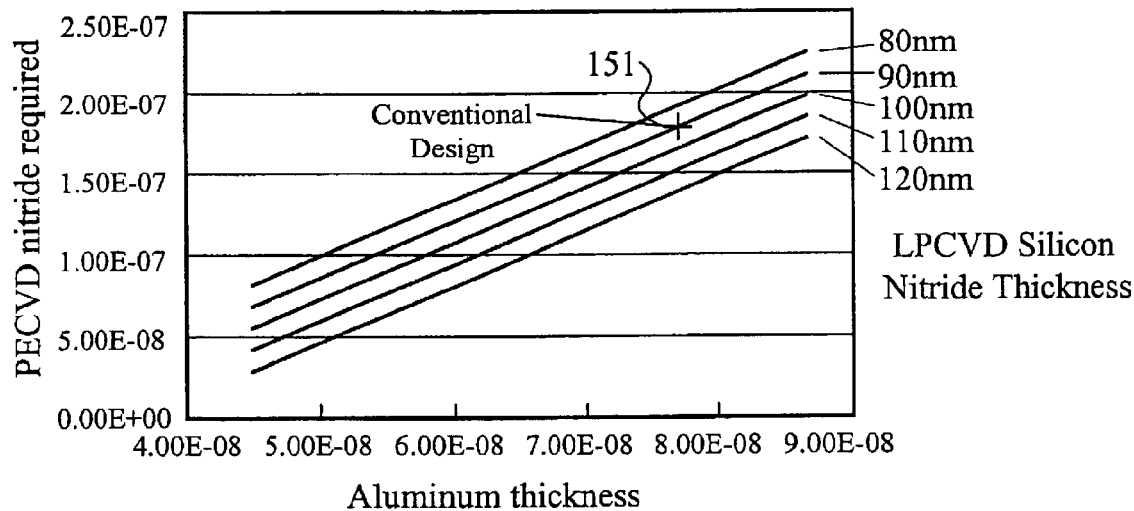
FIG. 14 graphically illustrates the PECVD thickness required for athermalization as a function of aluminum thickness at five different resilient layer thicknesses.

FIG. 14 graphically illustrates the thickness of an athermalizing PECVD layer required to athermalize a ribbon at various thicknesses of the resilient layer of 80 nm, 90 nm, 100 nm, 110 nm and 120 nm over a range of aluminum thicknesses from about 45 nm to 85 nm. Using for exemplary purposes a resilient layer thickness of about 90 nm and an aluminum layer thickness of about 75 nm, FIG. 14 shows that a PECVD layer of about 160 nm is required for athermalization. As a result of the extra mass of the PECVD layer, the resonance frequency drops from about 1140 kHz to approximately 775 kHz. Although a ribbon athermalized with a PECVD silicon nitride layer is more supple than a layer formed by simply increasing the thickness of the LPCVD silicon nitride of the resilient layer, the pull down voltage of a ribbon with an athermalizing PECVD silicon nitride layer nevertheless increases to about 28 volts, roughly a forty percent increase.

Figure 15:
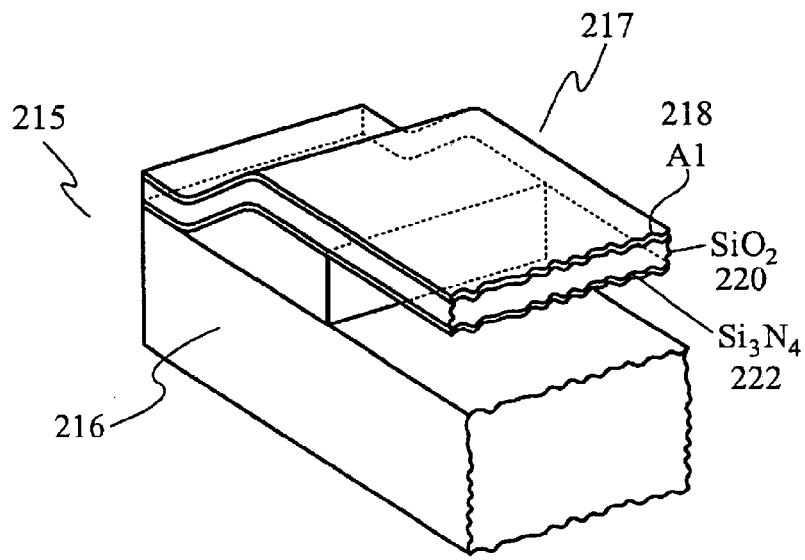
FIG. 15 is a perspective view illustrating a grating light valve™ light modulator comprising a ribbon with a silicon dioxide layer disposed between the resilient layer and the aluminum layer.

FIG. 15 illustrates a cross sectional view of a grating light valve™ light modulator and ribbon according to the silicon dioxide athermalization embodiment of the present invention. A layer of silicon dioxide $SiO_2$ is disposed between the aluminum and silicon nitride layers. Again using the thermal coefficient of expansion $\alpha_{sub}$, of the substrate as a reference of zero, the aluminum layer 218 has a positive thermal coefficient of expansion $\alpha_{Al}$, and the silicon dioxide 220 has a negative thermal coefficient of expansion $\alpha_{SiO2}$, thereby opposing the influence of the aluminum layer 218. By incorporating a silicon dioxide layer 220 of the proper thickness between the aluminum 218 and resilient 222 layers, the ribbon 217 is athermalized in relation to the substrate 216.

Figure 16:
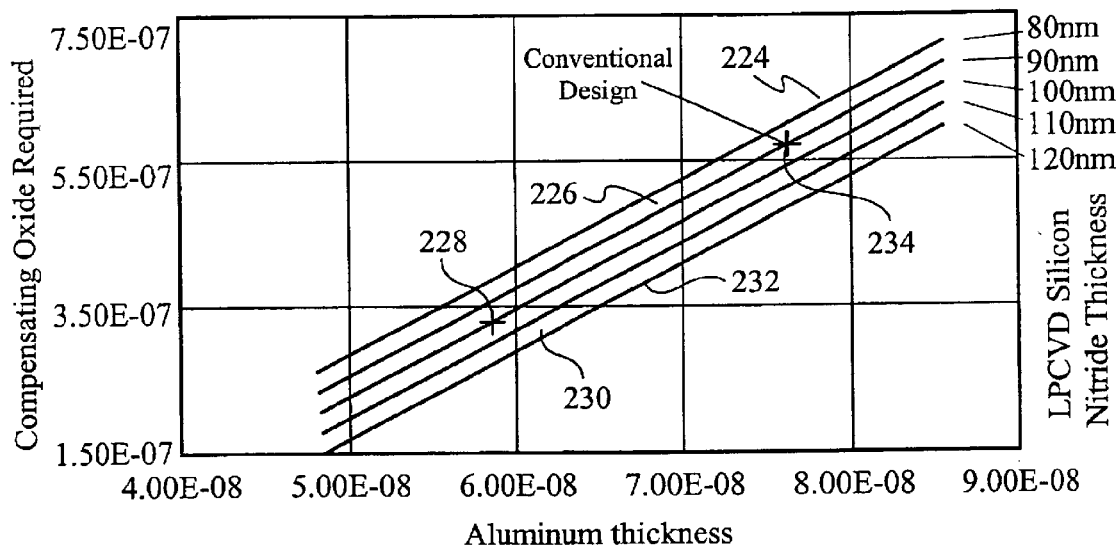
FIG. 16 graphically illustrates silicon dioxide thickness required for athermalization as a function of aluminum thickness at five different resilient layer thicknesses.

FIG. 16 graphically illustrates five separate curves representing resilient layer thicknesses of 80 mm, 90 nm, 100 nm, 110 nm and 120 nm respectively. Any one of these curves can be used to determine the required thickness of the silicon dioxide layer shown on the vertical axis to athermalize the ribbon 217 over the range of aluminum thicknesses shown on the horizontal axis. An asterisk 234 indicates a silicon nitride resilient layer thickness of approximately 93 nm and an aluminum thickness of roughly 76 nm, values commonly found in conventional approaches. At these values, the graph indicates that a "compensating silicon dioxide" layer would have to be approximately 560 nm thick. Because the silicon nitride layer also has a negative coefficient of expansion $\alpha_{Si3N4}$ with respect to the reference substrate value $\alpha_{SUB}$, the thicker silicon nitride layer also works to counteract the effects of the aluminum layer. Accordingly, at any given thickness for the aluminum layer, the thicker the silicon nitride layer, the thinner the silicon dioxide layer is required to athermalize the ribbon 217 of FIG. 15. For example, referring to FIG. 16, at an aluminum thickness of about 70 nm, athermalization of the ribbon in FIG. 15 is achieved with a silicon nitride layer 222 that is about 80 nm thick by a silicon dioxide layer approximately 520 nm thick. When the silicon nitride layer 222 is increased to about 120 nm thickness at the same aluminum thickness of about 70 nm, the thickness of the silicon dioxide layer necessary to achieve athermalization is reduced to approximately 400 nm.

An advantage of the silicon dioxide layer embodiment is that its tension and elasticity are lower than that of the resilient silicon nitride layer, and accordingly, it does not raise the pull down voltage. In fact, experimental evidence indicates that the suppleness of the ribbon achieved by the silicon dioxide technique actually decreases the pull-down voltage by 35%. Because of the greater mass resulting from the silicon dioxide layer, however, the resonance frequency is slowed from about 1140 kHz to 275 kHz. Whether or not the slower frequency is a disadvantage depends on a particular application. In the fabrication process, individual ribbons are "cut" from a continuous sheet, typically by chemically etching a series of parallel gaps in the sheet, thereby defining a series of elongated ribbons separated by gaps. Increased ribbon thickness puts more demands on the ribbon gap lithographic process and etch chemistry, causing the gaps to be wider with increasing ribbon thickness. As the size of the gap between the ribbons increases, the higher gap-to-ribbon aspect ratio allows for a greater loss of incoming radiation through the gaps.

Figure 17:
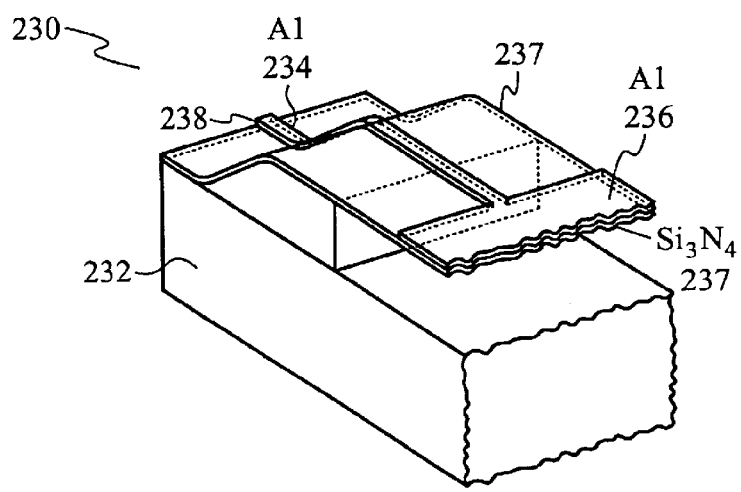
FIG. 17 is a perspective view illustrating a grating light valve™ light modulator with an aluminum layer comprising less surface area than the surface area of the ribbon.

FIG. 17 shows a reduced aluminum embodiment 230 of the present invention wherein the athermalization layer includes an embodiment of the aluminum layer 234, 236 itself. The surface area of the aluminum layer 234, 236 is reduced by reducing the width of the aluminum layer to a narrow conduit 234 from the end 238 of the ribbon and extending longitudinally along the ribbon up to the optically interactive portion of the aluminum surface 236, which functions to reflect or diffract incoming electromagnetic waves. The aluminum widens, preferably to a width identical to the ribbon at the active area of the ribbon 237. The conduit 234 allows the aluminum to maintain electrical continuity with a voltage source, and the wider reflective surface 236 is disposed on the active area of the ribbon configured to reflect incoming light. Accordingly, the narrow conduit has little negative effect on the efficiency of the reflective surface since it does not extend to the active area of the ribbon surface. The reduction in surface area of aluminum reduces the effect which the aluminum has on the aggregate thermal expansion of the ribbon, thereby athermalizing or partially athermalizing the ribbon 230 with respect to the substrate 232. The effective ribbon tension can be represented by equation 2 below:

$$S(p) = \frac{w \cdot t_{Si3N4}(E_{Si3N4} \cdot t_{Si3N4} \cdot \sigma_{Si3N4} + p \cdot E_{Si3N4} \cdot t_{Al} \cdot \sigma_{Al} + (1-p) \cdot E_{Al} \cdot t_{Al} \cdot \sigma_{Al})}{(E_{Si3N4} \cdot t_{Si3N4} + (1-p) E_{al} \cdot t_{Al})}$$

Wherein S(p) is tension as a function of the percent "p" of the ribbon surface covered by aluminum, w is the width of the ribbon, t is the thickness of the layer, E is Young's modulus of elasticity, and σ represents stress in pascals.

The effective linear mass of the ribbon can be determined according to equation 3:

$$M(p) = (3/8 \, p^5 - 15/8 \, p^4 + 5/2 \, p^3)\rho_{Al} \cdot w \cdot t_{Al} \rho_{Si3N4} \cdot w \cdot t_{Si3N4} \quad 3)$$

wherein M(p) is the effective mass as a function of the percent of the ribbon surface covered by aluminum and ρ is the density of a material referenced by the subscript. Using the equations of effective linear mass and effective ribbon tension, the resonant frequency can be represented in equation 4:

$$v(p) = \{3.162/(2 \cdot \pi \cdot L)\} \cdot sqrt((S(p)/(M(p))) \quad 4)$$

wherein 3.162 is selected as the square root of ten, v(p) is the frequency as a function of the percent of the ribbon surface covered by aluminum and L is the ribbon length. Using the equation of effective linear mass, the damping time is represented by equation 5:

$$\tau(p) = (\pi^3 \cdot d^3 \cdot M(p)/(48 \cdot \eta_{\mathit{eff}} \cdot w) \quad 5)$$

wherein τ(p) is the damping constant as a function of the percent "p" of the ribbon surface covered with aluminum, d is the distance from the substrate electrode to the resilient layer in the ribbon, and $\eta_{\mathit{eff}}$ is the dynamic viscosity of the gas damping the ribbon, usually measured in micro poise.

Figure 18:
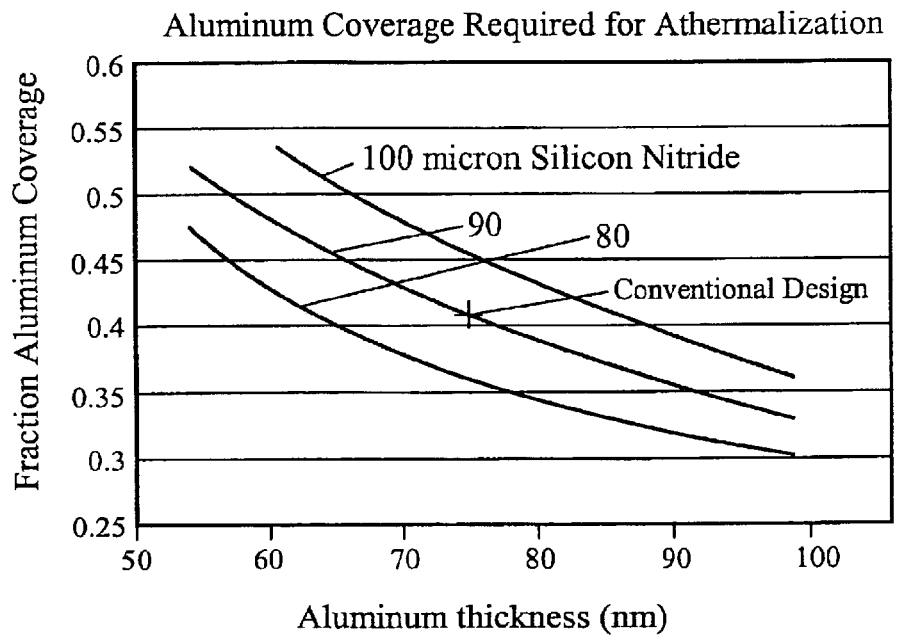
FIG. 18 graphically illustrates the fraction of aluminum coverage over the surface area of a ribbon required for athermalization as a function of aluminum thickness, for three different resilient layer thicknesses.

FIG. 18 graphically illustrates the aluminum coverage required for athermalization as a function of aluminum thickness. Three separate curves illustrate this function for three different thicknesses of the resilient layer 230 of silicon nitride. To achieve athermalization at an exemplary aluminum thickness of 75 nm and an exemplary silicon nitride thickness of about 90 nm, according to FIG. 18, the surface area of the aluminum would have to be reduced to roughly 41 percent of the surface area of the ribbon. Again, the asterisk illustrates thicknesses for the aluminum layer and the resilient layer commonly found in conventional embodiments.

Figure 19:
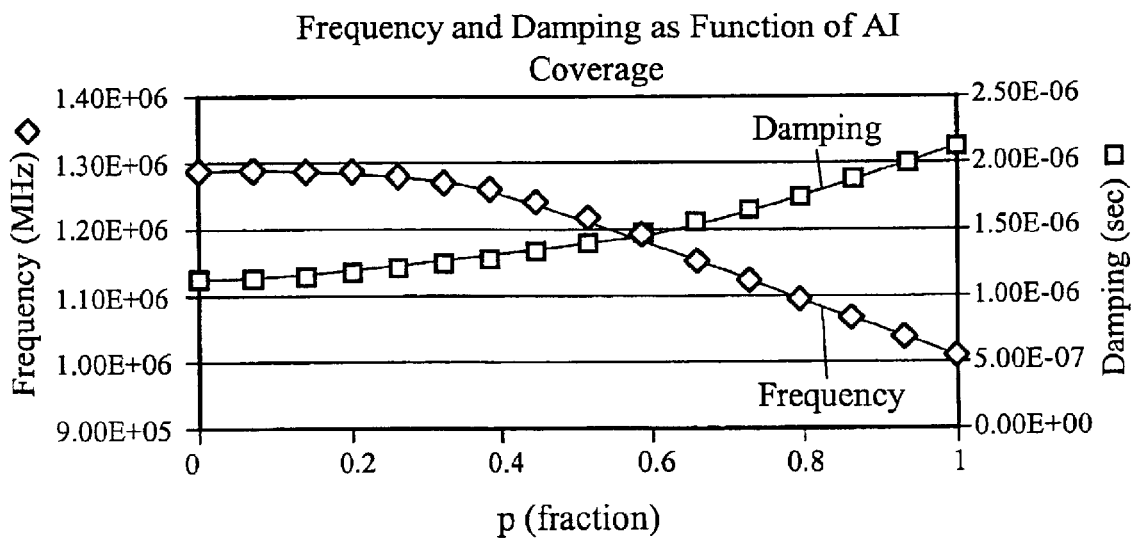
FIG. 19 graphically illustrates ribbon resonance frequency and damping time as a function of the percent of ribbon surface area covered by aluminum.

FIG. 19 illustrates frequency and damping as a function of the fraction of the surface covered with aluminum, ranging from zero aluminum to total aluminum coverage. The frequency, read against the left hand vertical axis, ranges from approximately 1 MHZ when the aluminum layer covers 100% of the ribbon surface, to a resonant frequency of about 1.28 MHz when no aluminum is present. The right hand vertical axis shows the gradations for damping in seconds. By reducing the percent coverage of aluminum, the mass of the ribbon is reduced. As the mass of the ribbon is reduced, the air or other damping gas between the ribbon and the substrate has a greater damping effect. Accordingly, damping occurs in approximately 1.2 micro seconds with no aluminum, but is slowed to approximately 2 micro seconds with 100% aluminum coverage.

Figure 20:
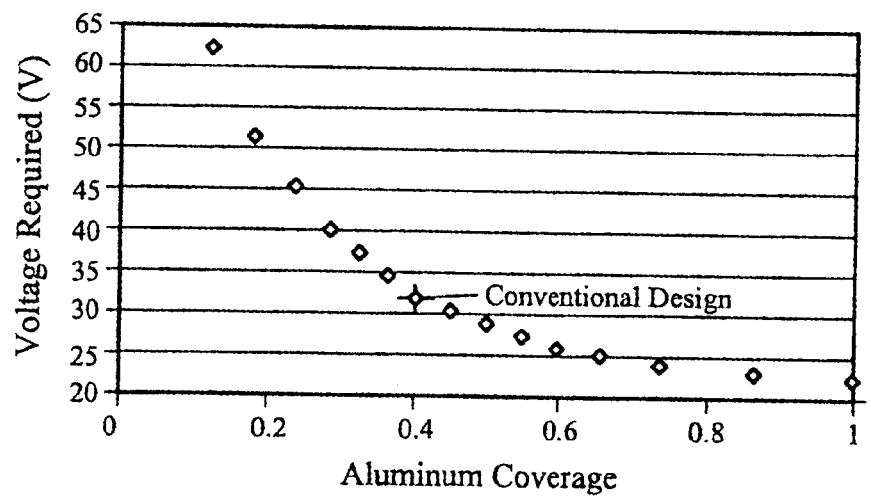
FIG. 20 graphically illustrates pull down voltage as a function of aluminum coverage, normalized at 22 volts for full aluminum coverage.

FIG. 20 is a graphical illustration of the pull down voltage as a function of the ratio of the aluminum surface area to the ribbon surface area. Because the amount of charge accumulated on the aluminum is dependant upon the surface area of the aluminum, at 100% coverage, the pull down voltage is only about 22 volts. As the percent of surface area is decreased, the pull down voltage must be increased to compensate for the smaller surface area of aluminum available for collecting charge.

Figure 21:
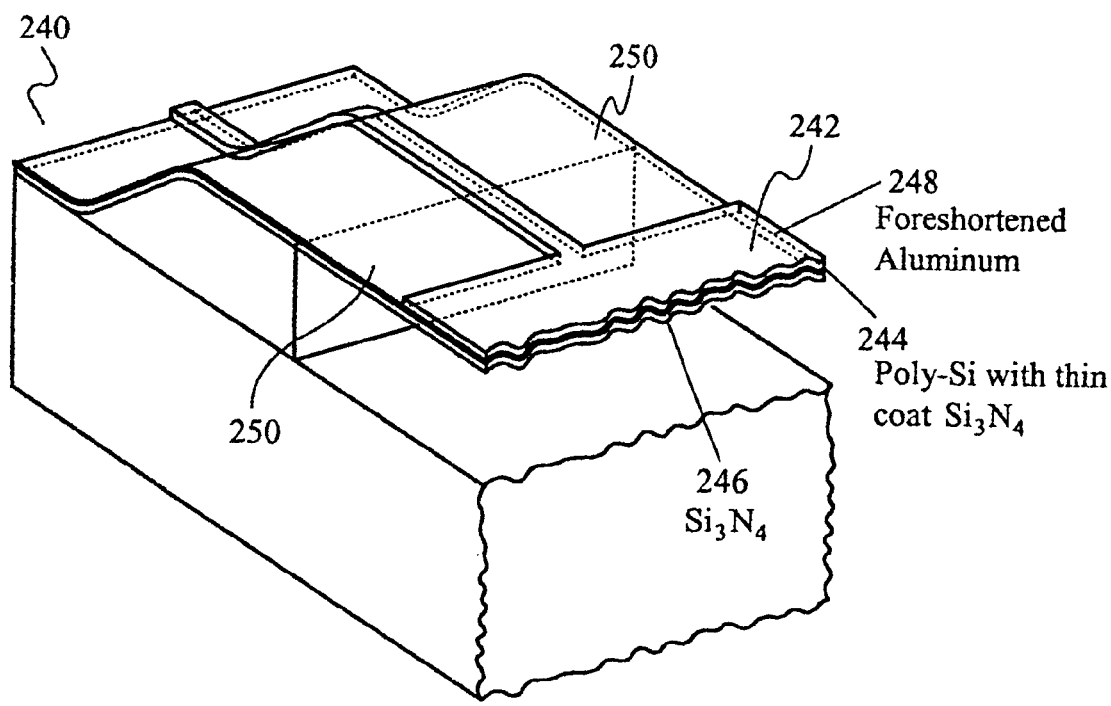
FIG. 21 is a perspective view illustrating a grating light valve™ light modulator with a reduced surface area aluminum layer and a poly-silicon layer covering the entire ribbon surface to increase the capacitance of the ribbon.

FIG. 21 illustrates an embodiment of the reduced aluminum embodiment combined with a poly-silicon layer preferably disposed between the aluminum 248 and the silicon nitride (resilient) layer 246. It was observed in conjunction with FIG. 20 that a reduction in aluminum surface area requires a progressively greater pull down voltage. An advantage of the reduced aluminum/poly-silicon embodiment therefore is that the poly-silicon 244 is capable of sustaining a potential that aids in the pull down of the ribbon. By extending the poly-silicon layer across the entire surface area of the ribbon, the pull down voltage is roughly the same voltage requirement as for those embodiments wherein the surface area of the aluminum had never been reduced. The reduced-aluminum/poly-silicon embodiment produces a slight increase in resonance frequency of approximately 28% and will lower the damping constant by approximately 45%. Because the poly-silicon is subject to etching in many manufacturing processes, it is preferable that any exposed poly-silicon is protected by a layer of silicon nitride, preferably LPCVD silicon nitride. In addition, in order to provide sufficient conductivity of the poly-silicon, the poly-silicon needs to be doped such as with phosphorous (P), increasing the conductivity. In embodiments utilizing a conductive poly-silicon layer such as a phosphorous doped embodiment, the aluminum conduits 253 depicted in FIGS.

21 and 22 and discussed further herein are optional provided the conductive poly-silicon layer is grounded to the same anchor as the aluminum layer in the previous embodiments, and provided the conductive poly-silicon layer is conductively coupled with the aluminum layer.

Within the reduced aluminum/poly silicon embodiment, two embodiments are envisioned for protecting the poly silicon from etching. According to the thin-coat embodiment, the resilient layer of a standard thickness, such as 100 nm, is beneath poly-silicon. The poly-silicon rests on top of the resilient layer. The aluminum layer rests on top of the poly-silicon layer. The exposed portions of the poly-silicon layer 244 adjacent the narrow aluminum conduit are then coated with a very thin coating of silicon nitride 250. Because it is important that the aluminum layer 242 and the poly-silicon layer 244 are the same potential, the thin coating 250 of silicon nitride should not extend under the aluminum, but only on the exposed areas of the poly-silicon layer 244. Because the thin coating of silicon nitride 250 may be much thinner than the actual resilient layer 246, the thin-coat layer 250 serves to protect the poly-silicon 244 from chemical etching, but has little effect on adding to the resilience of the ribbon.

Figure 22:
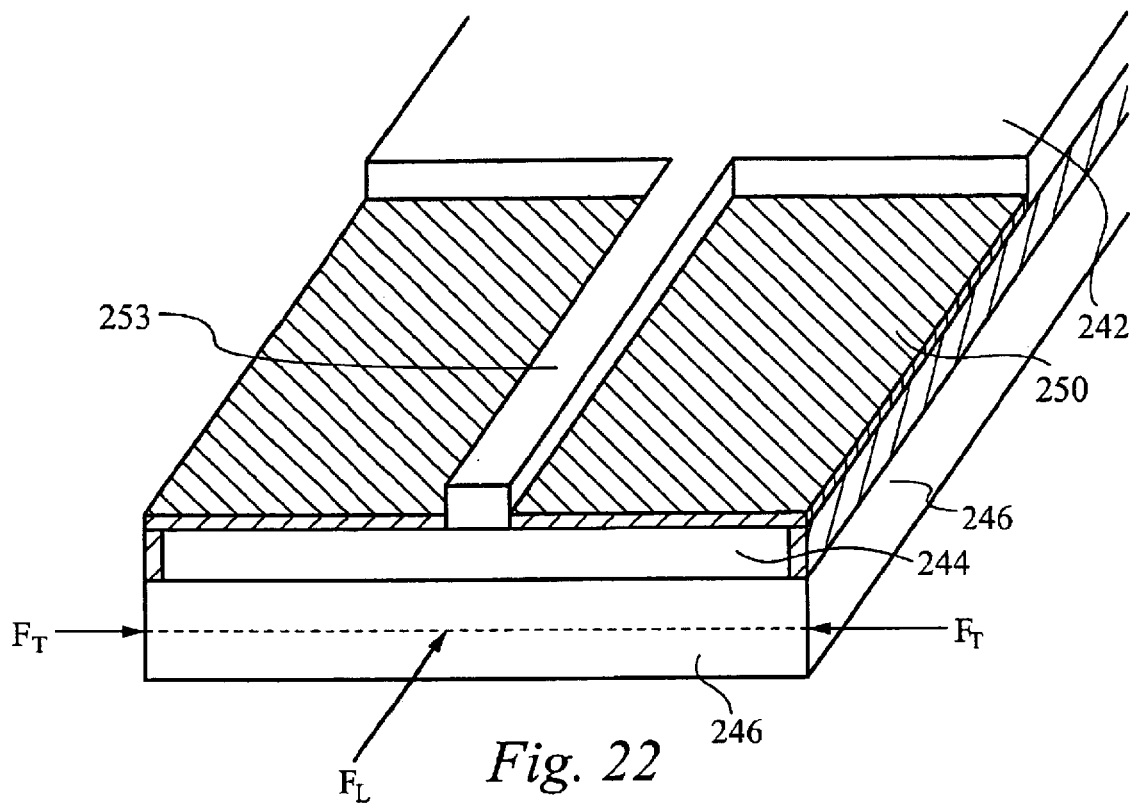
FIG. 22 illustrates a perspective view of a grating light valve™ light modulator with a reduced surface area aluminum layer, a poly-silicon layer, and a thin-coat silicon nitride layer protecting areas of the poly-silicon layer not covered by the aluminum.

FIG. 22 is an illustration of a thin-coat silicon nitride/reduced aluminum ribbon. The resilient layer 246 and the thin-coat layer 250 are preferably both a silicon nitride. Though not necessarily to scale, FIG. 22 nevertheless illustrates that the thin-coat layer 250 of silicon nitride is substantially thinner than the resilient layer 246 of silicon nitride. As discussed above, the poly-silicon 244, which acts to increase the surface area through which the field operates, thereby lowering the required pull down voltage. However, the poly-silicon layer 244 does little to contribute to the tension of the ribbon. Because of its inherent properties, silicon nitride is responsible for a disproportionate amount of the tensile force of the ribbon relative to its thickness. However, because the silicon nitride thin-coat layer 250 is so thin compared to the resilient layer 246, the tensile force is directed or distributed primarily through the resilient layer, along the dotted lines, with lateral forces indicated by FL and tangential forces indicated by FT.

Figure 23:
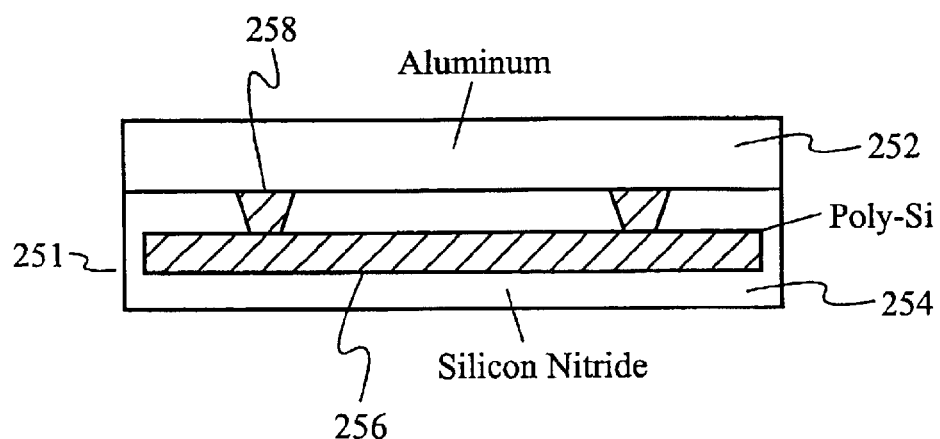
FIG. 23 illustrates a cross sectional view of a ribbon of a grating light valve™ light modulator with a poly-silicon layer sandwiched between equal thickness silicon nitride layers, and vias coupling the poly-silicon layer to the aluminum.

As an alternative to the thin-coat embodiment, FIG. 23 illustrates a cross sectional view of a poly-silicon sandwich embodiment. The poly-silicon layer 256 is embedded within the resilient silicon nitride layer 254, with half the mass of the resilient layer 254 above the poly-silicon layer 256 and half the mass of the resilient layer 254 below the poly-silicon layer 256. This symmetry serves to minimize ribbon warpage, whether the warpage would be due to tensile forces distributed through the ribbon, or thermal expansion and contraction of the component layers of the ribbon.

To fully protect the poly-silicon 256 from etching, the preferred embodiment of FIG. 23 further illustrates that the silicon nitride encompasses the poly-silicon on the sides as well as the top and bottom. Because the main purpose of the poly-silicon is to sustain an electrical field, it can be appreciated that if the poly-silicon layer 256 were electrically insulated within the silicon nitride layer 256, the aluminum layer would be floating with respect to the ground potential. Accordingly, FIG. 23 illustrates conductive poly-silicon vias 258 which extend from the poly-silicon layer 256 to the aluminum layer 252, extending through the resilient silicon nitride layer 254. The vias 258 allow charge to be evenly distributed from the aluminum layer to the poly-silicon layer, and bring the aluminum to the poly-Si potential.

Figure 24:
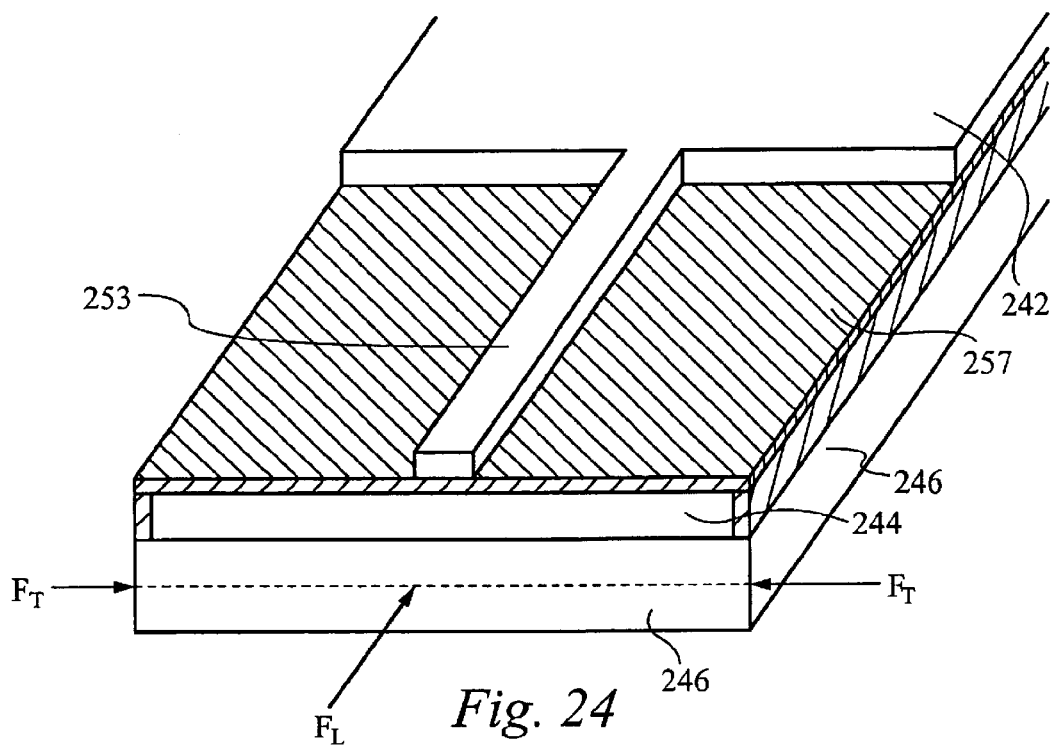
FIG. 24 illustrates a perspective view of a grating light valve™ light modulator with a reduced surface area aluminum layer, a poly-silicon layer, and a "candy-coat" oxidation layer on the upper and side surface of the conductive poly-silicon layer.
Figure 25:
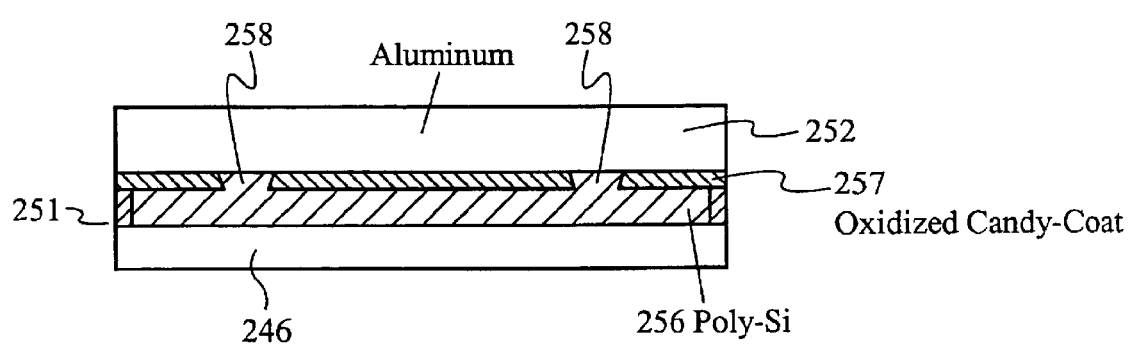
FIG. 25 illustrates a cross sectional view of a ribbon of a grating light valve™ light modulator having an oxidized upper surface of a conductive a poly-silicon layer with vias coupling the non-oxidized portion of the conductive polysilicon layer to the aluminum layer.

FIGS. 24 and 25 illustrate a final embodiment incorporates the resilient layer as a silicon nitride. A poly-Silicon layer 244 is deposited on top of the resilient layer 246, and doped with Phosphorous to increase conductivity. The poly-Si is oxidized such that the outside layer (top and sides) of the poly-Si is "candy coated" with oxide 257. Because the preferred embodiment envisions the oxidation process performed before the aluminum is laid down, the oxidation layer 257 will act to insulate the aluminum 242 from the conductive poly-silicon 244. Vias 258 function to conduct charge between the poly-Si layer and the aluminum.

While the invention was described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Accordingly, the figures and detailed description recited herein are not intended to limit the present invention, but are merely intended to illustrate a particular implementation of the present invention, and to enable those skilled in the art to utilize the principles of the invention set forth herein.

Although the present invention is applicable to any MEMS device, application of the present invention to a grating light valve™ light modulator will be used for exemplary purposes throughout much of this description. Those skilled in the art will recognize that the invention discussed herein and the appended claims are applicable to many MEMS devices wherein motion, range of motion, tension, compression, angles of orientation, and other physical properties are affected by members comprising disparate thermal coefficients of expansion.

What is claimed is:

1. A method of operational athermalization of a MEMS device over a temperature range, the MEMS device comprising a first member coupled to a second member, the first member having a first aggregate thermal coefficient of expansion represented by a first value and a second member having a second aggregate thermal coefficient of expansion represented by a second value, the method comprising a step of reducing a difference between the first value and the second value, wherein the step of reducing a difference between the first value and the second value comprises a step of altering the first value to a third value, wherein the step of altering the first thermal coefficient of expansion from the first value to the third value comprises a step of adding an athermalization layer to the first member during a fabrication process, wherein the athermalization layer comprises a thermal coefficient of expansion represented by a fourth value distinct from the first value, and wherein the athermalization layer comprises a plasma enhanced chemical vapor deposit silicon nitride.

2. A method of operational athermalization of a MEMS device over a temperature range the MEMS device comprising a first member coupled to a second member, the first member having a first aggregate thermal coefficient of expansion represented by a first value and a second member having a second aggregate thermal coefficient of expansion represented by a second value, the method comprising a step of reducing a difference between the first value and the second value, wherein the step of reducing a difference between the first value and the second value comprises a step of altering the first value to a third value, wherein the step of altering the first thermal coefficient of expansion from the first value to the third value comprises a step of adding an athermalization layer to the first member during a fabrication process, wherein the athermalization layer comprises a thermal coefficient of expansion represented by a fourth value distinct from the first value, and wherein the athermalization layer comprises silicon dioxide.

3. A method of operational athermalization of a MEMS device over a temperature range, the MEMS device comprising a first member coupled to a second member, the first member having a first aggregate thermal coefficient of expansion represented by a first value and a second member having a second aggregate thermal coefficient of expansion represented by a second value, the method comprising a step of reducing a difference between the first value and the second value, wherein the step of reducing a difference between the first value and the second value comprises a step of altering the first value to a third value, wherein the step of altering the first thermal coefficient of expansion from the first value to the third value comprises a step of adding an athermalization layer to the first member during a fabrication process, wherein the athermalization layer comprises a thermal coefficient of expansion represented by a fourth value distinct from the first value, wherein the athermalization layer is disposed within the first member between a first layer and a second layer, wherein the first member is a ribbon and the second member is a substrate, and wherein the ribbon further comprises a resilient layer and a reflective layer.

4. A method of operational athermalization of a MEMS device over a temperature range, the MEMS device comprising a first member coupled to a second member, the first member having a first aggregate thermal coefficient of expansion represented by a first value and a second member having a second aggregate thermal coefficient of expansion represented by a second value, the method comprising a step of reducing a difference between the first value and the second value, wherein the step of reducing a difference between the first value and the second value comprises a step of altering the first value to a third value, and wherein the first member is a ribbon and the second member is a substrate, the ribbon comprising a resilient layer and a reflective layer.

5. The method according to claim 4 wherein the step of altering the first aggregate thermal coefficient of expansion from the first value to the third value comprises a step of increasing a thickness of the resilient layer.

6. The method according to claim 4 further comprising a step of reducing an amount of material comprising the reflective layer.

7. The method according to claim 6 wherein the step of reducing the amount of material comprising the reflective layer includes a step of reducing a thickness of the reflective layer.

8. The method according to claim 6 wherein the step of reducing the amount of material comprising the reflective layer includes a step of reducing a surface area of the reflective layer.

9. An apparatus for athermalizing a MEMS device over a temperature range, the MEMS device comprising a first member coupled to a second member, the first member having a first aggregate thermal coefficient of expansion represented by a first value and the second member having a second aggregate thermal coefficient of expansion represented by a second value, the apparatus for athermalizing the MEMS device comprising an athermalization layer disposed within the first member, wherein the athermalization layer is configured to reduce a difference between the first value and the second value, and wherein the second member is a substrate, and the first member is a ribbon comprising a reflective layer and a resilient layer.

10. The apparatus according to claim 9 wherein the athermalization layer comprises an athermalization material distinct from a material comprising the resilient layer and distinct from a material comprising the reflective layer.

11. The apparatus according to claim 10 wherein the athermalization material is selected from among a group consisting of poly-silicon dioxide and silicon nitride including plasma enhanced chemical vapor deposit silicon nitride.

12. The apparatus according to claim 10 wherein the resilient layer comprises a first silicon nitride layer and a second silicon nitride layer, and wherein the athermalization component comprises a poly-silicon layer disposed between the first silicon nitride layer and the second silicon nitride layer.

13. The apparatus according to claim 12 wherein the poly-silicon layer is coupled to the reflective layer to fix a field potential of the reflective layer.

14. The apparatus according to claim 13 wherein the poly-silicon layer is coupled to the reflective layer by means of poly-silicon vias extending from the poly-silicon layer to the reflective layer through the first silicon nitride layer.

15. The apparatus of claim 13 wherein the poly-silicon is coupled to the reflective layer at a first end of the ribbon.

16. The apparatus according to claim 9 wherein a surface area covered by the reflective layer is less than a surface area of the ribbon.

17. The apparatus according to claim 16 wherein the athermalization layer further comprises an athermalization component distinct from the reflective layer.

18. The apparatus according to claim 9 wherein the athermalization layer comprises the reflective layer and the resilient layer, wherein a thickness of the reflective layer comprises a thickness of between about 45 and 65 nanometers and the resilient layer comprises a thickness of between about 160 and 240 nanometers.

* * * * *